US011233490B2

(12) United States Patent
De Assis et al.

(10) Patent No.: US 11,233,490 B2
(45) Date of Patent: Jan. 25, 2022

(54) CONTEXT BASED VOLUME ADAPTATION BY VOICE ASSISTANT DEVICES

(71) Applicant: MOTOROLA MOBILITY LLC, Chicago, IL (US)

(72) Inventors: Wendel Malta De Assis, Campinas (BR); Amit Kumar Agrawal, Bangalore (IN); Lucie Corinne Evelyne Papelier, Shenzhen (CN)

(73) Assignee: Motorola Mobility LLC, Chicago, IL (US)

( * ) Notice: Subject to any disclaimer, the term of this patent is extended or adjusted under 35 U.S.C. 154(b) by 133 days.

(21) Appl. No.: 16/690,390

(22) Filed: Nov. 21, 2019

(65) Prior Publication Data
US 2021/0159867 A1 May 27, 2021

(51) Int. Cl.
*G10L 15/22* (2006.01)
*G06F 3/16* (2006.01)
*H03G 3/24* (2006.01)
*G06K 9/00* (2006.01)

(52) U.S. Cl.
CPC .............. *H03G 3/24* (2013.01); *G06F 3/165* (2013.01); *G06F 3/167* (2013.01); *G06K 9/00275* (2013.01); *G10L 15/22* (2013.01); *G10L 2015/223* (2013.01); *G10L 2015/225* (2013.01)

(58) Field of Classification Search
CPC ...... H03G 3/24; G06K 9/00275; G10L 15/22; G10L 2015/225; G10L 2015/223; G06F 3/167; G06F 3/165
See application file for complete search history.

(56) References Cited

U.S. PATENT DOCUMENTS

| | | | | |
|---|---|---|---|---|
| 9,965,247 B2 * | 5/2018 | Jarvis | ....................... | G10L 17/00 |
| 10,170,123 B2 * | 1/2019 | Orr | ......................... | G10L 17/22 |
| 10,514,888 B1 * | 12/2019 | Rodgers | .................. | G10L 25/78 |
| 2003/0167167 A1 * | 9/2003 | Gong | ...................... | G10L 15/22 |
| | | | | 704/250 |
| 2015/0186156 A1 * | 7/2015 | Brown | .................. | G06Q 10/10 |
| | | | | 715/706 |
| 2016/0173049 A1 * | 6/2016 | Mehta | ...................... | H03G 3/32 |
| | | | | 381/57 |
| 2018/0310100 A1 * | 10/2018 | Raghavan | ................ | H04R 3/04 |
| 2018/0349093 A1 * | 12/2018 | McCarty | ............... | H04L 12/282 |
| 2019/0044745 A1 * | 2/2019 | Knudson | ............ | H04L 12/2821 |

(Continued)

*Primary Examiner* — Oyesola C Ojo
(74) *Attorney, Agent, or Firm* — Isidore PLLC

(57) ABSTRACT

A method includes detecting an input that triggers a virtual assistance (VA) on an electronic downdevice (ED) to perform a task that includes outputting audio content through a speaker associated with the ED. The method includes identifying a type of the audio content to be outputted through the speaker. The method includes determining whether a registered user of the ED is present in proximity to the ED. Each registered user is associated with a unique user identifier. The method includes, in response to determining that no registered user is present in proximity to the ED, outputting the audio content via the speaker at a current volume level of the ED. The method includes in response to determining that a registered user is in proximity to the ED, outputting the audio content at a selected, preferred volume level based on pre-determined or pre-established volume preference settings of the registered user.

20 Claims, 11 Drawing Sheets

(56) References Cited

U.S. PATENT DOCUMENTS

2019/0051289 A1* 2/2019 Yoneda ................ G10L 15/07
2019/0320281 A1* 10/2019 Guo .................... G10L 19/00
2020/0034108 A1* 1/2020 Mozer ................. H03G 3/3005
2020/0152205 A1* 5/2020 Sayyadi-Harikandehei ...............
　　　　　　　　　　　　　　　　　　　　　　　G10L 17/06

* cited by examiner

US 11,233,490 B2

CONTEXT BASED VOLUME ADAPTATION BY VOICE ASSISTANT DEVICES

BACKGROUND

1. Technical Field

The present disclosure generally relates to electronic devices with voice assistant, and more particularly to electronic devices with a voice assistant that performs context-based volume adaptation and context-based media selection.

2. Description of the Related Art

Virtual assistants are software applications that understand natural language and complete electronic tasks in response to user inputs. For example, virtual assistants take dictation, read a text message or an e-mail message, look up phone numbers, place calls, and generate reminders. As additional examples, virtual assistants read pushed (i.e., proactively-delivered) information, trigger music streaming services to play a song or music playlist, trigger video streaming services to play a video or video playlist, and trigger media content to be played through a speaker or display. Most electronic devices output audio content at the volume level last set for speakers associated with the electronic device. Some devices return to a default setting at each power-on event.

Multiple residents of a dwelling may share an electronic device that is equipped with a virtual assistant. Humans have heterogeneous preferences, so the different users of the virtual assistant have different needs. For example, a person who has a hearing impairment (i.e., "hearing-impaired person" or "hearing-impaired user") may prefer to hear voice replies from the virtual assistant at a louder volume level than other people/users who do not have a hearing impairment and with whom the electronic device with the virtual assistant is shared. When a hearing-impaired user accesses the virtual assistant following use of the device by a non-hearing-impaired person, the hearing-impaired user typically has to provide a series of additional requests (often with repeated instructions) to the virtual assistant in order to have the virtual assistant increase the volume level of the output to enable the hearing-impaired user to hear the audio output from the electronic device.

Mobile devices, such as smartphones, are examples of electronic devices equipped with a virtual assistant. A user may carry his/her mobile device from home to work, or from a solitary environment to a social environment including friends or family. The user may have different preferences of music genres and audio levels for each of the different environments in which the user utilizes his/her mobile device. The user thus has to manually or verbally set or adjust the mobile device at each different situation and remember to adjust volume setting or select a different music genre, etc., based on the user's current environment.

BRIEF DESCRIPTION OF THE DRAWINGS

The description of the illustrative embodiments is to be read in conjunction with the accompanying drawings. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
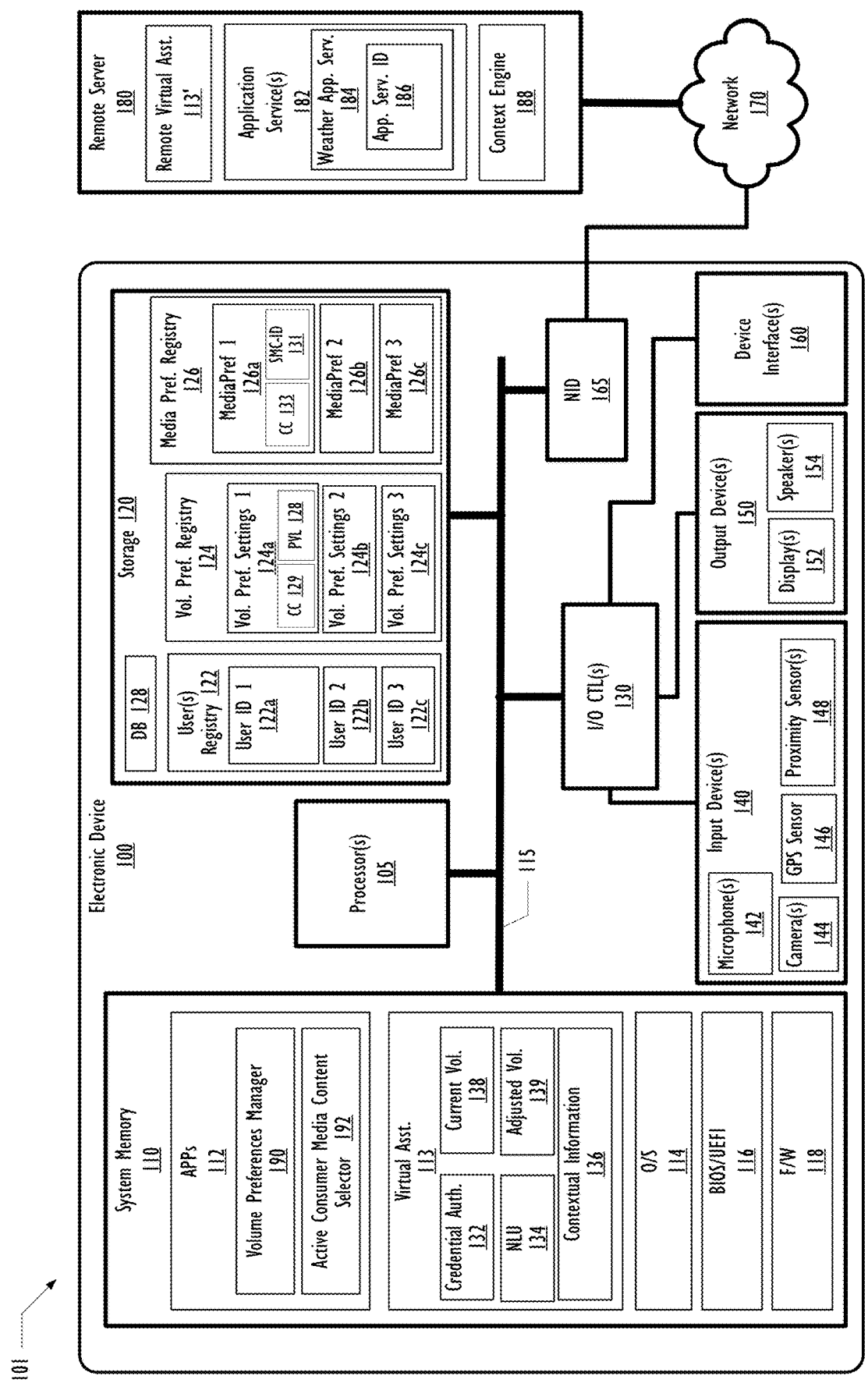
FIG. 1 is a block diagram representation of an example data processing system within which certain aspects of the disclosure can be practiced, in accordance with one or more embodiments of this disclosure.

The illustrative embodiments describe a method, an electronic device providing functionality of a virtual assistant (VA), and a computer program product for context-based volume adaptation by a VA of the electronic device. Additionally, the illustrative embodiments describe a method, an electronic device providing functionality of a VA, and a computer program product that configures an electronic device to selectively output media content of a detected registered user that is an active consumer.

The method for context-based volume adaptation by a voice assistant of the electronic device includes detecting, at an electronic device configured with a virtual assistant (VA), an input that triggers the VA to perform a task. The task comprises outputting an audio content through a speaker associated with the electronic device. The method includes identifying a type of the audio content to be outputted through the speaker. The method includes determining whether a registered user of the electronic device is present in proximity to the electronic device. Each registered user is associated with a unique user identifier (user ID). The method includes, in response to determining that no registered user is present in proximity to the electronic device, outputting the audio content via the speaker at a current volume level of the electronic device The method includes, in response to determining that a registered user is present in proximity to the electronic device, outputting the audio content at a selected, preferred volume level based on volume preference settings of the registered user.

According to one aspect, within the method, the selected, preferred volume level corresponds to a context defined in part by the user ID of the registered user and the type of audio content, the context being defined in the stored volume preference settings of the registered user. The method also includes identifying the type of the audio content as one of a voice reply type or a media content type. The method includes, in response to identifying the audio content as the voice reply type of audio content, outputting the audio content at a first preferred volume level corresponding to the context, which is determined, in part by the voice reply type of audio content. The method includes, in response to identifying the audio content as the media content type of audio content, outputting the audio content at a second preferred volume level corresponding to the context, which is determined, in part by the media content type of audio content.

According to another embodiment, an electronic device providing functionality of a virtual assistant (VA) includes at least one microphone that receives user input. The electronic device includes an output device that outputs media content. The electronic device includes a memory storing an active consumer media content selector (ACMCS) module. The ACMCS module configures the electronic device to determine whether each registered user detected in proximity to the electronic device is an active consumer and to selectively output media content associated with a media preferences profile of each detected registered user that is an active consumer. The electronic device also includes a processor that is operably coupled to the at least one microphone, the memory, and the output device. The processor executes the ACMCS module, which enables the electronic device to detect an input that triggers the VA to perform a task that comprises outputting media content through the output device. The processor detects a presence of at least one registered user in proximity to the electronic device. Each registered user is associated with a corresponding media preferences profile. For each detected registered user, the processor determines whether the detected registered user is an active consumer. The processor, in response to determining that a detected registered user is an active consumer, outputs, via the output device, media content associated with the media preferences profile of the detected, active registered user.

According to one aspect, the processor executes the ACMCS module, which enables the electronic device to detect a change of state for the detected registered user from being an active consumer to being a non-consumer. The processor stops outputting media content associated with the media preferences profile of the detected registered user whose state changed from being an active consumer to a non-consumer.

According to one additional aspect of the disclosure, a method is provided that includes detecting, at an electronic device (ED) providing a VA, an input that triggers the VA to perform a task that includes outputting media content through an output device associated with the ED. The method includes detecting a presence of at least one registered user in proximity to the ED. Each registered user is associated with a corresponding media preferences profile. The method includes, for each detected registered user, determining whether the detected registered user is an active consumer. The method includes, in response to determining that a detected registered user is an active consumer, select-ing and outputting, via the output device, media content associated with the media preferences profile of the detected registered user.

In the following description, specific example embodiments in which the disclosure may be practiced are described in sufficient detail to enable those skilled in the art to practice the disclosed embodiments. For example, specific details such as specific method sequences, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "alternate embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various aspects are described which may be aspects for some embodiments but not other embodiments.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be provided its broadest interpretation given the context in which that term is utilized.

Those of ordinary skill in the art will appreciate that the hardware components and basic configuration depicted in the following figures may vary. For example, the illustrative components within the presented devices are not intended to be exhaustive, but rather are representative to highlight components that can be utilized to implement the present disclosure. For example, other devices/components may be used in addition to, or in place of, the hardware depicted. The depicted example is not meant to imply architectural or other limitations with respect to the presently described embodiments and/or the general disclosure.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments.

FIG. 1 illustrates a block diagram representation of an electronic device, specifically electronic device 100, within which one or more of the described features of the various embodiments of the disclosure can be implemented. Electronic device 100 may be a smart speaker modular-attachment, smart speaker, smartphone, tablet, a data processing system (DPS), a handheld device, personal computer, a server, a network storage device, or any other suitable device, and may vary in size, shape, performance, functionality, and price. Within communication system 101, electronic device 100 can communicate with remote server 180 and other external devices via network 170.

Example electronic device 100 includes one or more processor(s) 105 coupled to system memory 110 via system interconnect 115. System interconnect 115 can be interchangeably referred to as a system bus, in one or more embodiments. Also coupled to system interconnect 115 is storage 120 within which can be stored one or more software and/or firmware modules and/or data.

As shown, system memory 110 can include therein a plurality of software and/or firmware modules including application(s) 112, a virtual assistant (VA) client module 113, operating system (O/S) 114, basic input/output system/ unified extensible firmware interface (BIOS/UEFI) 116, and other firmware (F/W) 118. The various software and/or firmware modules have varying functionality when their corresponding program code is executed by processor(s) 105 or other processing devices within electronic device 100.

VA client module 113 is also referred to as simply VA 113. As described more particularly below, applications 112 include volume preferences manager module 190, and active consumer media content selector module 192. Volume preferences manager (VPM) module 190 may be referred to as simply VPM 190. Active consumer media content selector (ACMCS) module 192 may be referred to as simply ACMCS 192.

VA 113 is a software application that understands natural language (e.g., using a natural language understanding (NLU) system 134). NLU system 134 may be referred to as simply NLU 134. VA 113 includes credentials authenticator 132, NLU 134, contextual information 136, current volume level 138, and adjusted volume level 139. VA 113 receives voice input from microphone 142, and VA 113 completes electronic tasks in response to user voice inputs. For example, a user speaks aloud to electronic device 100 to trigger VA 113 to perform a requested task. NLU 134 enables machines to comprehend what is meant by a body of text that is generated from converting the received voice input. Within electronic device 100, NLU 134 receives the text converted from the voice input from a user and determines the user intent based on the text converted from the voice input. For example, in response to receiving "Turn it up" as user input, NLU 134 determines the user intent of changing the current volume level 138 to an increased volume level. For example, in response to receiving "Play Beyoncé" as user input, NLU 134 determines the user intent of playing back artistic works performed by a specific artist named Beyoncé. VA 113 obtains the user intent from NLU 134. For example, VA 113 can receive user input to initiate and action, such as take dictation, read a text message or an e-mail message, look up phone numbers, place calls, generate reminders, read a weather forecast summary, trigger playback of a media playlist, and trigger playback of a specific media content requested by the user.

Credentials authenticator 132 (shown as "Credential Auth") verifies that the voice input received via microphone 142 comes from a specific person, namely, a specific registered user of the electronic device 100. Credentials authenticator 132 initially registers the voice of an individual person when he or she utters words during a voice ID registration/training session. During the voice ID registration/training session, credentials authenticator 132 receives and stores voice characteristics, such as tone, inflection, speed, and other natural language characteristics, as a voice ID associated with one of the unique user ID(s) 122a-122c (stored in users registry 122 within storage 120). To later identify the individual person as a registered user or to authenticate voice input from the individual person as being from a registered user, VA 113 prompts the individual to utter the same or other words to electronic device 100 (via microphone 142). As an example only, users registry 122 includes three (3) user IDs 1-3 122a-122c, as illustrated in FIG. 1. It is understood that electronic device 100 can be associated with more or fewer than three users, and that storage 120 can store user ID, volume preference settings, and media preference setting for each registered user of electronic device 100. Credentials authenticator 132 checks users registry 122 for a matching one of registered user ID 122a-122c, by comparing voice characteristics received within the voice input to the known characteristics within user ID(s) 122a-122c to determine a match. Credentials authenticator 132 identifies that the received voice input is from a specific registered user (e.g., User 1) of electronic device 100 when the user ID (e.g., User ID 1 122a) corresponding to that specific registered user matches the received voice input. On the other hand, credentials authenticator 132 identifies that the received voice input is from a non-registered user (e.g., a guest) when the received voice input does not correspond to any of the user IDs of users registry 122. Credentials authenticator 132 attaches or associates a non-registered status indicator to the received voice input (or other form of user input) from the non-registered user.

In some embodiments, storage 120 can be a hard drive or a solid-state drive. The one or more software and/or firmware modules within storage 120 can be loaded into system memory 110 during operation of electronic device 100. Storage 120 includes users registry 122 that stores user IDs 122a-122c of each registered user of electronic device 100. A registered user is a person having a profile and/or authorized user ID 122a-122c that is associated with, or accessed on, the particular electronic device 100. For example, an authorized user can be an owner of electronic device 100. In some embodiments, electronic device 100 can be associated with multiple authorized users, such as owner of electronic device 100 and child of the owner, spouse of the owner, or roommate of the owner. That is, user registry 122 can include a separate user ID for the owner of electronic device 100 and a separate user ID for the spouse of the owner. For example, User ID 1 122a corresponds to User 1, who is a registered user of electronic device 100. Similarly, User ID 2 and User ID 3 correspond to User 2 and User 3, respectively, who are other registered users of electronic device 100. User 1, User 2, and User 3 could share ownership or privileges to use electronic device 100. Within user registry 122, a particular person may be associated with multiple identifiers, such as a voice ID, face ID, fingerprint ID, and pattern code. As introduced above, user ID 1 122a includes a voice ID. The voice ID identifies a particular person based upon a voice input from that particular person. In some embodiments, user ID 1 122a includes a face ID. The face ID identifies a particular person based upon images within which the face of that particular person is captured (e.g., during a face ID registration/training session).

Credentials authenticator 132, in some embodiments, enhances the determination that the received voice input matches the user ID corresponding to the specific registered user by obtaining facial recognition information from camera 145. The face recognition information can indicate whether a person currently within view of camera 145 has facial features that match the registered user ID (e.g., a previously registered face ID of User ID 1 122a) corresponding to the specific registered user. Credentials authenticator 132 confirms that specific registered user (e.g., User 1) of electronic device 100 has been identified when the corresponding user ID (e.g., User ID 1 122a) contains the voice ID and/or face ID that matches the received voice input and/or captured facial features. It is understood that credentials authenticator 132 can use various methods for determining whether the voice input received via microphone 142 contains speech from a registered user of the electronic device 100, and that this disclosure does not include an exhaustive list of such methods.

Storage 120 stores volume preference registry 124, including a respective set of volume preference settings 124a-124c corresponding to each individual registered user of electronic device 100. Each of the volume preference settings 1-3 124a-124c can also be referred to as a volume preferences profile of corresponding registered users 1-3. For example, volume preference registry 124 includes volume preference settings 1 124a corresponding to User 1. Similarly, volume preference registry 124 includes volume preference settings 2 124b and volume preference settings 3 124c corresponding to User 2 and User 3, respectively. Each of the user-specific volume preference settings 1-3 124a-124c stores at least one preferred volume level 128 (PVL) that is linked to a context criteria 129 (shown as "CC"). Additional details about volume preference registry 124 are described below with reference to FIG. 3.

Storage 120 stores multiple media preferences registry 126 (shown as Media Pref. Registry"), including a separate media preferences profile corresponding to each individual registered user of electronic device 100. For example, media preferences registry 126 includes media preferences profile 1 126a (shown in FIG. 1 as "MediaPref 1") corresponding to User 1. Similarly, media preferences registry 126 includes media preferences profile 2 126b and media preferences profile 3 126c corresponding to User 2 and User 3, respectively. In the illustrated embodiment, media preferences profile 1 126a stores at least one specific media content identifier 131 (shown as "SMC-ID") linked to a context criteria 133. SMC-ID 131 and context criteria 133, as a pair, represents a media preference setting. Media preferences profile 1 126a stores multiple individual media preference settings; however, for ease of illustration, only one is shown in FIG. 1. It is understood that, each of the media preferences profiles 1-3 126a-126c stores an identifier of a specific media content linked to a context criteria, in a similar manner to SMC-ID 131 and context criteria 133 within media preferences profile 1 126a. Media content outputted by electronic device 100 is not limited to audio content, audiovisual content, or video content, but also may include haptic content consumed by human sense of touch. As a technical advantage, SMC-ID 131 allows electronic device to identify which specific media content to access without requiring electronic deice 100 to store media content. Additional details about media preferences registry 126, including media preference profiles 126a-126c, are described below with reference to FIG. 4.

Electronic device 100 further includes one or more input/output (I/O) controllers 130, which support connection by, and processing of signals from, one or more connected input device(s) 140, such as a keyboard, mouse, touch screen, and sensors. As examples of sensors, the illustrative embodiment provides microphone(s) 142 and camera(s) 144. Microphone 142 detects sounds, including oral speech of a user(s), background noise, and other sounds, in the form of sound waves. Examples of user input received through microphone 142 includes voice input (i.e., oral speech of the user(s)), background noise (e.g., car engine noise, kitchen appliance noise, workplace typing noise, television show noise, etc.). Camera(s) 144 captures still and/or video image data, such as a video of the face of a user(s). Sensors can also include global position system (GPS) sensor 146, which enables electronic device 100 to determine a location in which electronic device 100 is located, for location-based audio and media context determinations). Sensors can also include proximity sensor(s) 148, which enables electronic device 100 to determine a relative distance of an object or user to electronic device 100. I/O controllers 130 also support connection to and forwarding of output signals to one or more connected output devices 150, such as display(s) 152 or audio speaker(s) 154. That is, output devices 150 could be internal components of electronic device 100 or external components associated with electronic device 100. In this disclosure, as an example only, the loudness capabilities of speaker(s) 154 corresponds to volume levels having integer values from zero (0) through ten (10). That is, volume level zero (0) represents off/mute, volume level ten (10) represents maximum volume capability of speaker(s) 154, and other values of volume levels represent integer multiples of maximum volume capability. For example, volume level one (1) represents ten percent (10%) of the maximum volume capability of speaker(s) 154. Additionally, in one or more embodiments, one or more device interface(s) 160, such as an optical reader, a universal serial bus (USB), a card reader, Personal Computer Memory Card International Association (PCMIA) slot, and/or a high-definition multimedia interface (HDMI), can be coupled to I/O controllers 130 or otherwise associated with electronic device 100. Device interface(s) 160 can be utilized to enable data to be read from or stored to additional devices (not shown) for example a compact disk (CD), digital video disk (DVD), flash drive, or flash memory card. These devices can collectively be referred to as removable storage devices and are examples of non-transitory computer readable storage media. In one or more embodiments, device interface(s) 160 can further include General Purpose I/O interfaces, such as an Inter-Integrated Circuit ($I^2C$) Bus, System Management Bus (SMBus), and peripheral component interconnect (PCI) buses.

Electronic device 100 further comprises a network interface device (NID) 165. NID 165 enables electronic device 100 to communicate and/or interface with other devices, services, and components that are located external (remote) to electronic device 100, for example, remote server 180, via a communication network. These devices, services, and components can interface with electronic device 100 via an external network, such as example network 170, using one or more communication protocols. Network 170 can be a local area network, wide area network, personal area network, signal communication network, and the like, and the connection to and/or between network 170 and electronic device 100 can be wired or wireless or a combination thereof. For simplicity and ease of illustration, network 170 is indicated as a single block instead of a multitude of collective components. However, it is appreciated that network 170 can comprise one or more direct connections to other devices as well as a more complex set of interconnections as can exist within a wide area network, such as the Internet.

Remote server 180 includes remote VA 113' and application service(s) 182. In one or more embodiments, application service(s) 182 includes multiple application services related to different topics about which users want to find out more information. Examples of application service(s) 182 could include a weather application service 184, a sports application service, a food application service, navigation services, messaging services, calendar services, telephony services, media content delivery services (e.g., video streaming services), or photo services. Application service(s) 182 enable remove VA 113' to obtain information for performing a user-requested task. In some embodiments, application service(s) 182 stores an application service ID that individually identifies each of the multiple application services. Weather application service ID 186 (shown as "App. Serv. ID") can be used to identify weather application service 184. The specific functionality of each of these components or modules within remote server 180 are described more particularly below.

Remote server 180 includes a context engine 188 that enables electronic device 100 to perform electronic tasks faster and to make a determination of the current context. For example, context engine 188 uses bidirectional encoder representations from transformers (BERT) models for making abstract associations between words, which enables VA 113' and electronic device 100 (using VA 113) to answer complex questions contained within user input (e.g., voice input). Context engine 188, together with a network-connected sensor hub, determines the relevant context and provides contextual data to electronic device 100. For example, electronic device 100 updates contextual information 136 based on the relevant contextual data received from context engine 188.

As introduced above, electronic device 100 also includes VPM 190. Within this embodiment, processor 105 executes VPM 190 to provide the various methods and functions described herein. For simplicity, VPM 190 is illustrated and described as a stand-alone or separate software/firmware/logic component, which provides the specific functions and methods described herein. More particularly, VPM 190 implements a VPM process (such as process 600 of FIG. 6) to perform context-based volume adaptation by VA 113, in accordance with one or more embodiments of this disclosure. However, in at least one embodiment, VPM 190 may be a component of, may be combined with, or may be incorporated within OS 114, and/or with one or more applications 112. For each registered user, VPM 190 makes automatic volume adjustment (e.g., manual or by voice) dependent upon the context in which audio content is output. The term "context" can be used to refer to a current context (e.g., current context 500 of FIG. 5A) or to refer to a hypothetical context that matches context criteria 129. The context is defined by one or more of the following context variables: the type of audio content that is output in performance of a task, the identification and location of a person(s) in a coverage space in proximity to electronic device 100, the active-consumer/non-consumer state (e.g., awake/asleep state) of registered users in proximity to electronic device 100, and the state of external devices associated with registered users of electronic device 100. Contexts are not limited to being defined by the context variables listed in this disclosure, and additional context variables can be used to define a context, without departing from the scope of this disclosure. More particularly, based on a determination that contextual information 136 corresponding to a current context matches context criteria 129, VPM 190 selects PVL 128 (namely, a value of volume level) at which speaker(s) 154 output audio content. Context criteria 129 is defined by context variables and specifies when to select its linked PVL 128. Contextual information 136 includes information indicating values of one or more of the context variables. VPM 190 and ACMCS 192 (either together or independently from each other) obtain contextual information 136 about the environment in which electronic device 100 operates and about changes in the environment. More particularly, contextual information 136 describes a current context, namely, describing the environment in which device 100 is currently operating. Contextual information 136 includes a context variable value indicating whether no one, one, or multiple people are present in proximity to electronic device 100. A more detailed description of VPM 190 obtaining contextual information about the current context is provided below. It is understood that ACMCS 192 obtains contextual information about the current context in the same or a similar manner as VPM 190.

Contextual information 136 includes identification (e.g., user ID or non-registered status) of which people, if any, are present in proximity to electronic device 100. VPM 190 determines whether a registered user of electronic device 100 is present in proximity to electronic device 100. In response to detecting that input received at input device(s) 140 matches characteristics associated with one or multiple user IDs 122a-122c, VPM 190 (using credentials authenticator 132) identifies which, if any, of the registered users (i.e., Users 1-3) is present in proximity to electronic device 100. In response to detecting that input received at input device(s) 140 does not match characteristics associated with any user ID within user registry 122, VPM 190 determines that no registered user is present in proximity to electronic device 100.

Contextual information 136 includes state information indicating whether a registered user in proximity to electronic device 100 is an active consumer or a non-consumer of media content to be output by speaker(s) 154 in performance of the task being performed by VA 113. In at least one embodiment, VPM 190 (using a keyword spotter technique) passively listens for keywords or monitors for other contextual clues indicating that a registered user is awake, asleep, blind, deaf, listening to headphones, absent, or otherwise disengaged from consuming media content output by electronic device 100. In at least one embodiment, VPM 190 assigns a group designation to each of multiple unique combinations of registered users, each group designation corresponding to user ID(s) of the active consumers.

Contextual information 136 includes an identifier of the type of audio content to be output by speaker(s) 154 when VA 113 performs the requested task. VPM 190 determines the type of the audio content as one of a voice reply type or a media content type. For example, VPM 190 (using VA 113 and NLU 134) determines the audio content is media content type when the task includes playing back media content such as music, video, podcast, or audiobook. As another example, VPM 190 (using NLU 134) determines the audio content is voice reply content type when the task includes scheduling a calendar event or reading out a weather forecast summary, a message, or a package tracking status, or outputting other voice replies.

Additionally, VPM 190 enables a registered user (e.g., user 1) to initially register to associate herself/himself to utilize VPM 190 together with volume preference registry 124. During initial registration, VPM 190 generates a set of volume preference settings 1 124a for the registered user. Initially, set of volume preference settings 1 124a may include a pre-determined, context criteria 129, but the linked PVL 128 (within the registry entry) comprises no value (i.e., null). In at least one alternative embodiment, set of volume preference settings 1 124a may initially include a pre-determined, context criteria 129, and the linked PVL 128 comprises a default value (e.g., an a priori value).

After VPM 190 completes registration of user 1, and electronic device 100 initially determines that contextual information 136 corresponding to the current context matches context criteria 129, VPM 190 selects the linked PVL 128 for context criteria 129. Also, at this initial time, VPM 190 determines that the set of volume preference settings 1 124a comprises no value for the linked PVL 128 selected. In response to determining the set of volume preference settings 1 124a comprises no value for the selected PVL 128, VPM 190 sets the linked PVL 128 to the current volume level 138. For instance, if current volume level 138 stores a value of seven (7) as the volume level last set for speakers 154 associated with the electronic device 100, then VPM 190 sets the linked PVL 128 to the identical value of seven (7).

Without any change in the current context, the registered user may not enjoy hearing audio content outputted from speaker 154 at volume level seven (7), and the registered user may react by inputting subsequent user input that corresponds to adjusting the speaker to an adjusted volume level 139. In response to receiving the user input that corresponds to adjusting the speaker to an adjusted volume level 139, VPM 190 updates the set of volume preference settings 1 124a such that the selected PVL 129 matches adjusted volume level 139. For instance, if the subsequent user input causes adjusted volume level 139 to store a value of three (3) as the volume level, then VPM 190 sets the selected PVL 129 to the identical value of three (3). Thus, VPM 190, over time, learns volume preferences of a registered user. That is, VPM 190 learns a PVL (or preferred range of volume levels) at which the registered user desires to hear the audio content in a specific context based on a historical tracking (e.g., in database (DB) 128) of the user's volume settings in each specific context. Additional aspects of VPM 190, and functionality thereof, are presented within the description of FIGS. 2-6.

VPM 192 improves user experience in several ways, including reducing the need to manually adjust volume levels based on the type of audio being output or based on the audience composition. For example, below is a sample dialogue for adjusting the volume level of speakers associated with a conventional electronic device, which does not have VPM 190, when a hearing-impaired user uses a virtual assistant after a non-hearing-impaired user has set the speakers to a low volume level (i.e., within a range of low volume levels 1-3) at an earlier time:

[Hearing-Impaired User]: "What is the weather?"
[Virtual Assistant]: starts replying at a low volume level (e.g., volume level 3).
[Hearing-Impaired User]: stops the virtual assistant
[Hearing-Impaired User]: asks the virtual assistant to increase the volume
[Hearing-Impaired User]: restates "What is the weather?"
[Virtual Assistant]: starts replying at a higher volume level (i.e., volume level greater than 3).

The hearing-impaired user of this dialogue must repeat her/his request ("What is the weather?") after changing the volume. Repeating commands may cause frustration or annoyance to the user of a VA-enabled electronic device. In another example scenario, the user may carry her/his mobile device from home to work, or from a solitary environment to a social environment that includes friends and/or family. The user may like to hear rock and pop genres of music when alone at home but likes to hear jazz music when at work. With a conventional electronic device, i.e., one that is not equipped or programmed with the functionality of VPM 190, the user has to speak a voice command to adjust the genre of music of the electronic device from rock/pop to jazz at work, and then readjust to rock/pop at home.

As another example, the user may like to hear the radio-edited-clean versions of music at a background volume level (i.e., within a range of volume levels between 3 and 5) when in the presence of family members, and may like to hear adult-explicit versions of music (of any genre) at volume level 8 or another high volume level (i.e., within a range of high volume levels 8-10) when alone. Based upon who, if anyone, is present with the user, the user has to not only speak a voice command to adjust the volume level of the electronic device (which does not have VPM 190), but also change the content of music. As described below, incorporation of the functionality of VPM 192 into the electronic device(s) improves user experience in several ways, including reducing the need to manually select specific media content based on the current context (e.g., based on location at which the media content is being output, or based on the audience composition). The user no longer needs to remember to request electronic device play the appropriate genre or music or at the appropriate volume level as the user's environmental context changes, as these changes are autonomously made by VA 113, based on detected context and location.

As introduced above, electronic device 100 also includes ACMCS 192. Within this embodiment, processor 105 executes ACMCS 192 to provide the various methods and functions described herein. For simplicity, ACMCS 192 is illustrated and described as a stand-alone or separate software/firmware/logic component, which provides the specific functions and methods described herein. More particularly, ACMCS 192 configures electronic device 100 to implement a process (such as process 700 of FIG. 7) to determine whether each registered user detected in proximity to electronic device 100 is an active consumer and to selectively output media content associated with a media preferences profile of each detected registered user that is an active consumer, in accordance with one or more embodiments of this disclosure. However, in at least one embodiment, ACMCS 192 may be a component of, may be combined with, or may be incorporated within OS 114, and/or with one or more applications 112. For each registered user, ACMCS 192 makes automatic media content selection (e.g., manual or by voice) dependent upon the context in which media content is output. The context can be defined the same or similar way as the various contexts defined in volume preference settings 1-3 124a-124c (described above). In at least one embodiment, ACMCS 192, over time, learns media content selection preferences of a registered user and stores the information within DB 128. That is, ACMCS 192 learns a preferred, specific media content that the registered user desires to consume in a specific context based on a historical tracking of the user's volume settings in each specific context. Additional aspects of ACMCS 192, and functionality thereof, are presented within the description of FIGS. 2-8.

Figure 2:
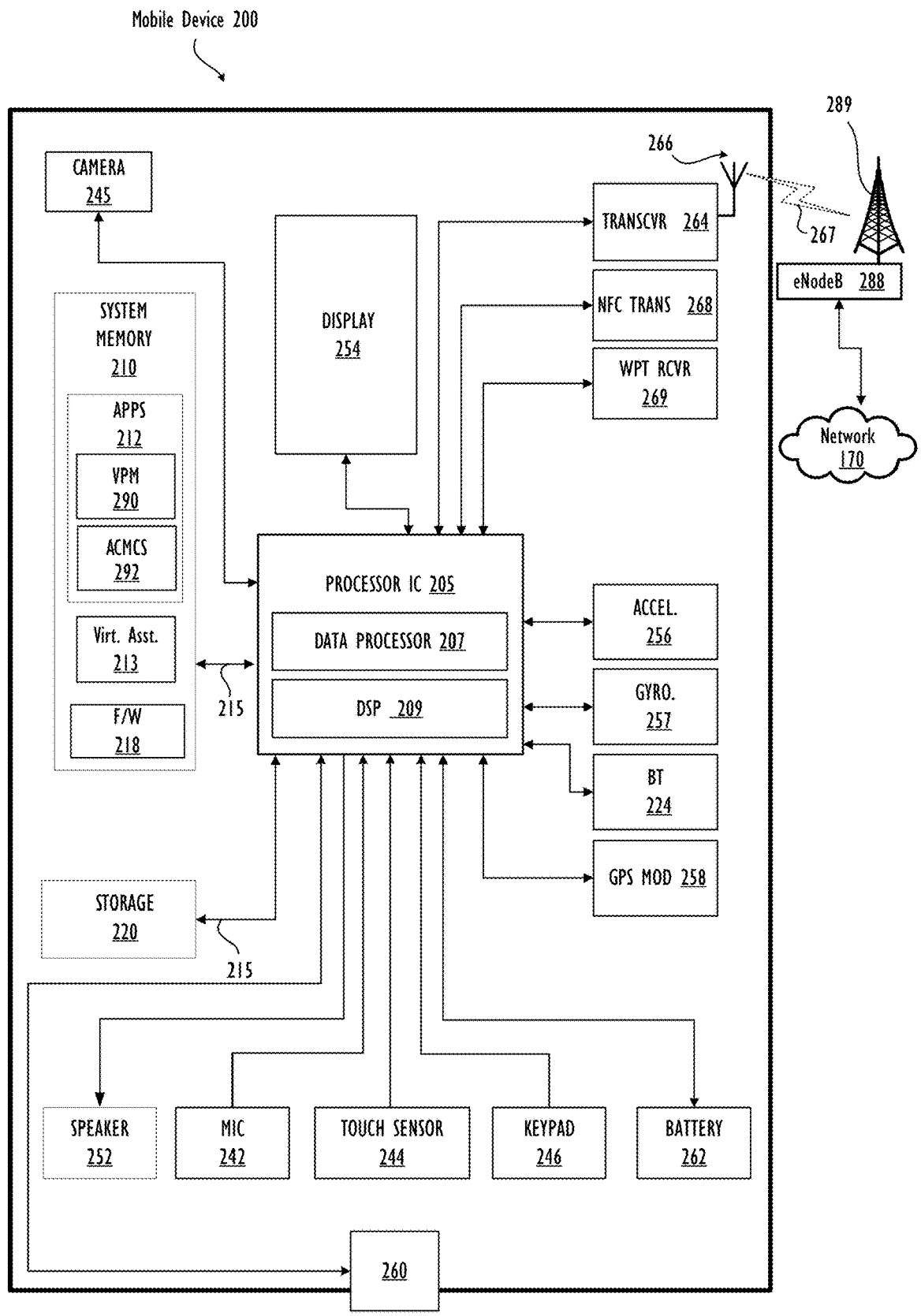
FIG. 2 illustrates a mobile device within which certain aspects of the disclosure can be practiced, in accordance with one or more embodiments of this disclosure.

In the description of the following figures, reference is also occasionally made to specific components illustrated within the preceding figures, utilizing the same reference numbers from the earlier figures. With reference now to FIG. 2, there is illustrated example mobile device 200. Mobile device 200 includes at least one processor integrated circuit, processor IC 205. Included within processor IC 205 are data processor 207 and digital signal processor (DSP) 209. Processor IC 205 is coupled to system memory 210 and non-volatile storage 220 via a system communication mechanism, such as system interconnect 215. System interconnect 215 can be interchangeably referred to as a system bus, in one or more embodiments. One or more software and/or firmware modules can be loaded into system memory 210 during operation of mobile device 200. Specifically, in one embodiment, system memory 210 can include therein a plurality of software and/or firmware modules, including firmware (F/W) 218. System memory 210 may also include basic input/output system and an operating system (not shown). The software and/or firmware modules provide varying functionality when their corresponding program code is executed by processor IC 205 or by secondary processing devices within mobile device 200.

Processor IC 205 supports connection by and processing of signals from one or more connected input devices such as microphone 242, touch sensor 244, camera 245, and keypad 246. Processor IC 205 also supports connection by and processing of signals to one or more connected output devices, such as speaker 252 and display 254. Additionally, in one or more embodiments, one or more device interfaces 260, such as an optical reader, a universal serial bus (USB), a card reader, Personal Computer Memory Card International Association (PCMIA) slot, and/or a high-definition multimedia interface (HDMI), can be associated with mobile device 200. Mobile device 200 also contains a power source, such as battery 262, that supplies power to mobile device 200.

Mobile device 200 further includes Bluetooth transceiver 224 (illustrated as BT), accelerometer 256, global positioning system module (GPS MOD) 258, and gyroscope 257, all of which are communicatively coupled to processor IC 205. Bluetooth transceiver 224 enables mobile device 200 and/or components within mobile device 200 to communicate and/or interface with other devices, services, and components that are located external to mobile device 200. GPS MOD 258 enables mobile device 200 to communicate and/or interface with other devices, services, and components to send and/or receive geographic position information. Gyroscope 257 communicates the angular position of mobile device 200 using gravity to help determine orientation. Accelerometer 256 is utilized to measure non-gravitational acceleration and enables processor IC 205 to determine velocity and other measurements associated with the quantified physical movement of a user.

Mobile device 200 is presented as a wireless communication device. As a wireless device, mobile device 200 can transmit data over wireless network 170. Mobile device 200 includes transceiver 264, which is communicatively coupled to processor IC 205 and to antenna 266. Transceiver 264 allows for wide-area or local wireless communication, via wireless signal 267, between mobile device 200 and evolved node B (eNodeB) 288, which includes antenna 289. Mobile device 200 is capable of wide-area or local wireless communication with other mobile wireless devices or with eNodeB 288 as a part of a wireless communication network. Mobile device 200 communicates with other mobile wireless devices by utilizing a communication path involving transceiver 264, antenna 266, wireless signal 267, antenna 289, and eNodeB 288. Mobile device 200 additionally includes near field communication transceiver (NFC TRANS) 268 wireless power transfer receiver (WPT RCVR) 269. In one embodiment, other devices within mobile device 200 utilize antenna 266 to send and/or receive signals in the form of radio waves. For example, GPS module 258 can be communicatively couple to antenna 266 to send/and receive location data.

As provided by FIG. 2, mobile device 200 additionally includes volume preferences manager module 290 (hereinafter "VPM" 290). VPM 290 may be provided as an application that is optionally located within the system memory 210 and executed by processor IC 205. Within this embodiment, processor IC 205 executes VPM 290 to provide the various methods and functions described herein. VPM 290 implements a VPM process (such as process 700 of FIG. 7) to perform context-based volume adaptation by VA for context-based volume adaptation by a voice assistant 213 of mobile device 200, in accordance with one or more embodiments of this disclosure. In at least one embodiment, VPM 290 may be a component of, may be combined with, or may be incorporated within one or more applications 212.

Also provided by FIG. 2, mobile device 200 additionally includes active consumer media content selector module 292 (hereinafter "ACMCS" 292). ACMCS 292 may be provided as an application that is optionally located within system memory 210 and executed by processor IC 205. Within this embodiment, processor IC 205 executes ACMCS 292 to provide the various methods and functions described herein. In accordance with one or more embodiments of this disclosure, ACMCS 292 configures mobile device 200 to implement a process (such as process 700 of FIG. 7) to determine whether there are registered users in proximity to mobile device 200 and whether a registered user detected in proximity to mobile device 200 is an active consumer. ACMCS 292 further configures mobile device 200 to selectively output media content associated with a media preferences profile of each detected registered user that is an active consumer. In at least one embodiment, ACMCS 292 may be a component of, may be combined with, or may be incorporated within one or more applications 212.

It is understood that VPM 290, virtual assistant 213 (illustrated as "Virt. Asst."), and ACMCS 292 of FIG. 2 can have the same or similar configuration as respective components VPM 190, VA 113, and ACMCS 192 of FIG. 1, and can perform the same or similar operations or functions as those respective components of FIG. 1. As an example, VA 213 of FIG. 2 could include components such as credentials authenticator 132, NLU 134, contextual information 136, current volume level 138, and adjusted volume level 139 shown in FIG. 1. It is also understood that mobile device 200 of FIG. 2 can also have the same or similar functional components as electronic device 100. For example, storage 220 of FIG. 2 could include components such as users registry 122, volume preference registry 124, media preferences registry 126, which are shown in FIG. 1. Similarly, electronic device 100 of FIG. 1 could include components shown in FIG. 2. For example, input device(s) 140 of FIG. 1 could include touch sensor 244 of FIG. 2. For simplicity, the remainder of the description shall be described from the perspective of electronic device 100 (FIG. 1) with the understanding that the features are fully applicable to mobile device 200. Specific reference to components or features specific to mobile device 200 shall be identified where required for a full understanding of the described features.

Figure 3:
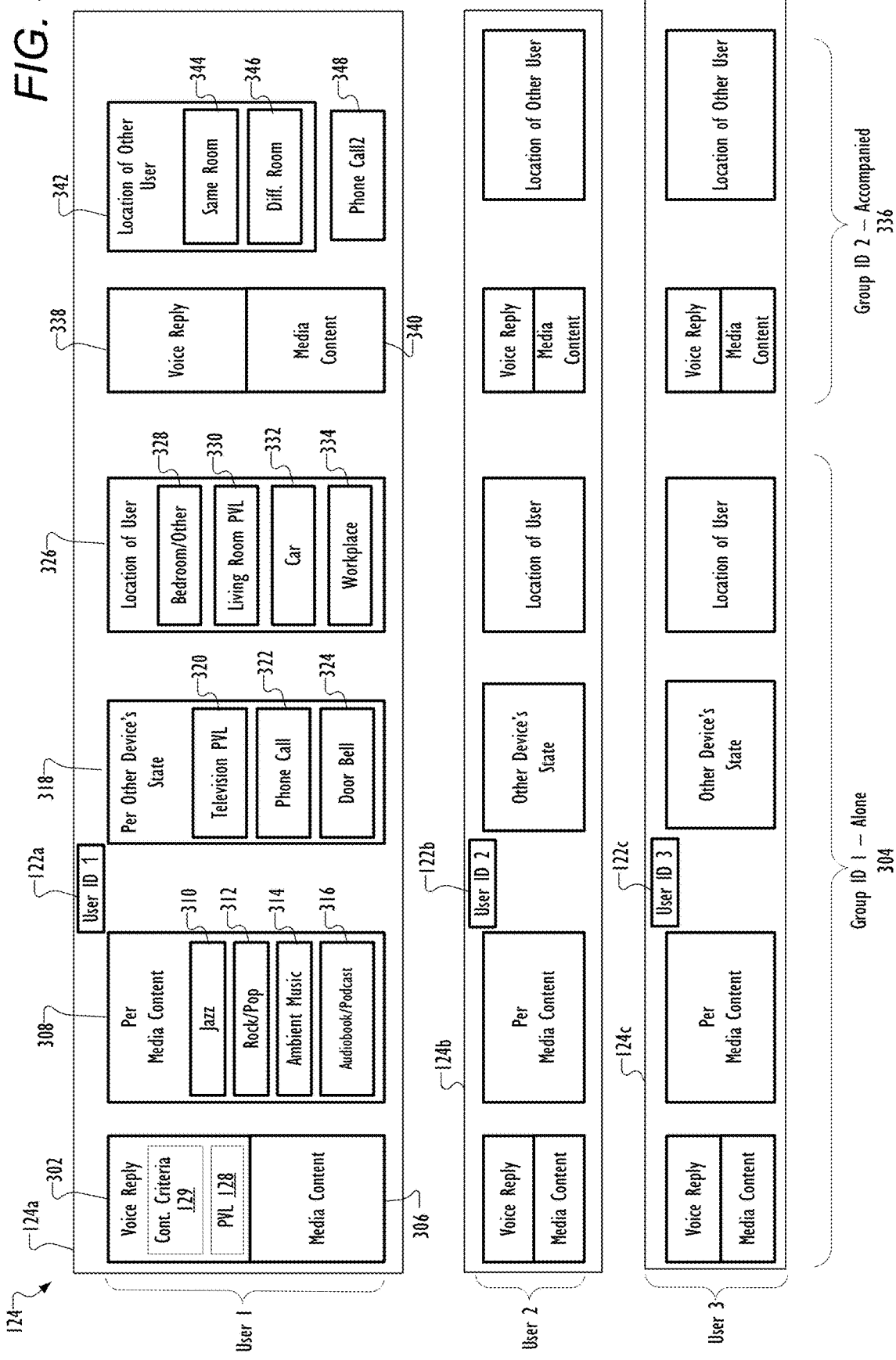
FIG. 3 illustrates components of volume preference settings of the electronic device of FIG. 1 or 2, in accordance with one or more embodiments.

With reference now to FIG. 3, there is illustrated components of volume preference registry 124 of electronic device 100 of FIG. 1, in accordance with one or more embodiments. Electronic device 100 performs automatic volume adjustment based on the current context in which speakers 154 output audio content. To enable automatic volume adjustment based on the desires of a registered user, each set of volume preference settings 1-3 124a-124c links the user ID (e.g., user ID 1 122a) of a registered user to a plurality of different individual volume preference settings (e.g., voice reply PVL 302) for different contexts. Each individual volume preference setting (e.g., voice reply PVL 302) is formed by a PVL 128 that is linked to context criteria 129. Volume preference settings 1 124a corresponding to User 1 will be described as an example. It is understood that details regarding volume preference settings 1 124a apply analogously to volume preference settings 2 124b and volume preference settings 3 124c, respectively, corresponding to User 2 and User 3.

Volume preference settings 1 124a stores a PVL or a range of PVLs at which User 1 desires to hear audio content when a defined, correlated context occurs. That is, in response to determining that contextual information 136 matches a context defined within volume preference settings 1 124a, VPM 190 (using volume preference registry 124) is able to select a PVL (i.e., from volume preference settings 1 124a) that corelates to the defined context. For example, voice reply PVL 302a specifies (i) a value of preferred volume level for speaker(s) 154 to output audio content containing voice replies and (ii) a context criteria defined in part by the voice reply type of audio content, user ID 1 122a, and alone designation 304 (shown as "Group ID 1—Alone"). Alone designation 304 generally identifies that one user is in proximity to electronic device 100, and in this example, specifically identifies that user 1 associated with user ID 1 122a is alone, in proximity of electronic device 100. VPM 190, in response to determining that contextual information 136 matches the context specified by voice reply PVL 302a, selects voice reply PVL 302a, and triggers speakers 154 to output the audio content at the value of preferred volume level specified by voice reply PVL 302a.

As input device(s) 140 continuously receive input corresponding to the environment and users around electronic device 100, electronic device 100 dynamically updates contextual information 136 based on the received input, which may cause VPM 190 to select a different preferred volume that specifies a context matching the updated contextual information 136. For example, VPM 190, in response to determining that updated contextual information 136 matches the context specified by media content PVL 306a, selects media content PVL 306a, and triggers speakers 154 to output the audio content at the value of preferred volume level specified by media content PVL 306a. Media content PVL 306a specifies a value of preferred volume level for speaker(s) 154 to output audio content containing media content, and specifies a context defined in part by the media content type of audio content, user ID 1 122a, and alone designation 304.

Volume preference settings 1 124a can be updated to include an additional PVL corresponding to at least one additional context variable, such as a topic of the voice reply, a genre of the media content, a state of an external electronic device associated with the first registered user, a location of the registered user relative to the electronic device, or a location of at least one concurrent consumer of the audio content other than the registered user. For example, volume preference settings 1 124a includes an additional PVL per media content 308a and per genre of media content. Jazz PVL 310a specifies a value of preferred volume level for speaker(s) 154 to output audio content containing jazz genre and specifies a context criteria defined in part by the jazz genre as the media content type of audio content, user ID 1 122a, and alone designation 304. Volume preference settings 1 124a includes volume preference settings for other genres of media content (shown in FIG. 3 as rock/pop PVL 312, ambient music PVL 314, and audiobook/podcast PVL 316), each of which specifies a value of PVL and specifies a corresponding context criteria. In some embodiments, volume preference settings 1 124a could include additional PVL per topic of voice reply, such as volume preference settings for weather-related voice replies, sports-related voice replies, food-related voice replies, etc.

Volume preference settings 1 124a includes an additional PVL per other device's state 318. For example, User 1 can own multiple electronic devices (e.g., a smart television, a network-connected video streaming player to which a non-smart television is connected, a smartphone, a smart doorbell with video-camera, smart refrigerator, etc.) that are connected to each other via network 170, and that utilize user ID 122a to identify User 1 as a registered user of each of the consumer electronics. Electronic device 100 can receive state information (318) from one or more other electronic devices and use the received state information as contextual information 136. For example, a television can have a MUTED state or AUDIBLE state. User 1 may desire electronic device 100 to output voice replies at a high volume level when her/his television is in the audible state, but output voice replies at volume level 3 when her/his television is muted. Television PVL 320 can specify a value (e.g., within range of high volume levels 8-10) of preferred volume level for speaker(s) 154 to output audio content, and specify a context defined in part by the AUDIBLE state of the television associated with user ID 1 122a, user ID 1 122a, and alone designation 304. In at least one embodiment, the context criteria, to which television PVL 320 is linked, is further defined in part by voice reply type of audio content (similar to 302a).

In addition to a television PVL, additional PVL per other device's state 318 includes PVLs that have specifications analogous to television PVL 320. FIG. 3 provides examples of these other devices' PVLs as first phone call PVL 322 and doorbell PVL 324. For example, VPM 190 may learn that User 1 likes (e.g., desires or repeatedly provides inputs that cause) electronic device 100 to output rock/pop genre media content at a high volume level when her/his smartphone is asleep, but output the rock/pop genre media content at volume level 1 while her/his smartphone is receiving an incoming call or otherwise on a call. Based on learned user desires, VPM 190 sets or updates values within first phone call PVL 322. As another example, based on learned user desires that relate to a state of a video-recording doorbell, VPM 190 sets or updates values within doorbell PVL 324.

Volume preference settings 1 124a includes an additional PVL per location of the corresponding registered user, location of user PVL 326. Bedroom PVL 328a specifies a value of preferred volume level for speaker(s) 154 to output audio content, and specifies a context defined in part by the bedroom location of user 1, user ID 1 122a, and alone designation 304. In at least one embodiment, electronic device 100 can determine the location of user 1 within a coverage space. For example, user 1 can move from a living room to a bedroom within her/his home, and based on a distance between user 1 and electronic device 100, electronic device 100 can determine a first location user 1 as the bedroom and a second location of user 1 as the living room. Living room PVL 330 specifies a value of preferred volume level for speaker(s) 154 to output audio content, and specifies a context defined in part by the living room location of user 1, user ID 1 122a, and alone designation 304. In at least one embodiment, electronic device 100 represents a mobile device (such as mobile device 200), which can be carried by user 1 from a first coverage space (e.g., within her/his home (e.g., 503 of FIGS. 5A-5C)) to a second coverage space (e.g., within the passenger cabin of her/his vehicle (e.g., 604 of FIGS. 6A and 6B)) to a third coverage space (e.g., at her/his workplace). Car PVL 332 specifies a value of preferred volume level for speaker(s) 154 to output audio content, and specifies a context defined in part by the vehicle passenger cabin location of user 1, user ID 1 122a, and alone designation 304. Similarly, workplace PVL 334 specifies a value of preferred volume level for speaker(s) 154 to output audio content, and specifies a context defined in part by the workplace location of user 1, user ID 1 122a, and alone designation 304.

Group designation 336 (shown as "Group ID 2—Accompanied") indicates that at least one other person (e.g., second registered user or non-registered user) is present in proximity to electronic device 100 along with user 1 (i.e., identified by user ID 122a). Volume preference settings 124a shows that voice reply PVL 302, additional PVL per media content 308, additional PVL per other device state 318, and additional PVL per location of the user 326, collectively specifies a context defined in part by alone designation 304. However, it is understood that volume preference settings 124a includes PVLs analogous to PVLs 302, 308, 318, and 326, each of which specifies a context defined in part by group designation 336. For example, voice reply PVL 338 is analogous to voice reply PVL 302 (described above), and media content PVL 340 is analogous to media content PVL 306 (described above). More particularly, voice reply PVL 338 specifies a value of preferred volume level for speaker(s) 154 to output audio content containing voice replies, and specifies a context defined in part by the voice reply type of audio content, user ID 1 122a, and group designation 336.

Volume preference settings 1 124a includes an additional PVL per location of an accompanying person (i.e., second registered user or non-registered user) 342 in proximity of electronic device 100 along with user 1. Same-room PVL 344a specifies a value of preferred volume level for speaker(s) 154 to output audio content. Same-room PVL 344 also specifies a context defined in part by (i) the location of the accompanying person being within a close-distance range to the location of user 1, user ID 1 122a, and (ii) group designation 336. As an example, if a distance between the locations of two objects/people exceeds a maximum separation distance as defined by close-distance range, then the two objects/people are considered to be in different rooms. In at least one embodiment, electronic device 100 can determine the location of an accompanying person relative the location of user 1. For example, based on facial recognition information received from camera 145, electronic device 100 can identify user 1 and detect the presence of at least one other person within the field of view of the camera lens. In at least one embodiment, electronic device 100 detects that, along with user 1, at least one other person is also present in proximity to electronic device 100, but the other person(s) is located apart from user 1. Different-room PVL 346 specifies a value of preferred volume level for speaker(s) 154 to output audio content, and specifies a context defined in part by (i) the location of the accompanying person being a different room, apart from the location of user 1, user ID 1 122a, and (ii) group designation 336.

Volume preference settings 1 124a includes a second phone call PVL 348 (shown as "Phone Call 2"), which specifies a context defined in part by group designation 336, and which is an additional PVL per other device's state. A smartphone (e.g., mobile device 200) can self-report (e.g., to remote server 180) state information indicating whether the smartphone is in an ASLEEP state or in a CALL state in which the smartphone is receiving an incoming call or otherwise carrying-out a call. As an example, VPM 190 may learn that User 1 likes electronic device 100 to output all audio content at volume level 1 while her/his smartphone is receiving an incoming call or otherwise performing a call function. Based on learned user desires, VPM 190 sets or updates values within second phone call PVL 348. Particularly, second phone call PVL 348 can specify a value (e.g., volume level 1) of preferred volume level for speaker(s) 154 to output audio content, and specify a context criteria defined in part by user ID 1 122a, the CALL state of the smartphone associated with user ID 122a, and group designation 336.

Figure 4:
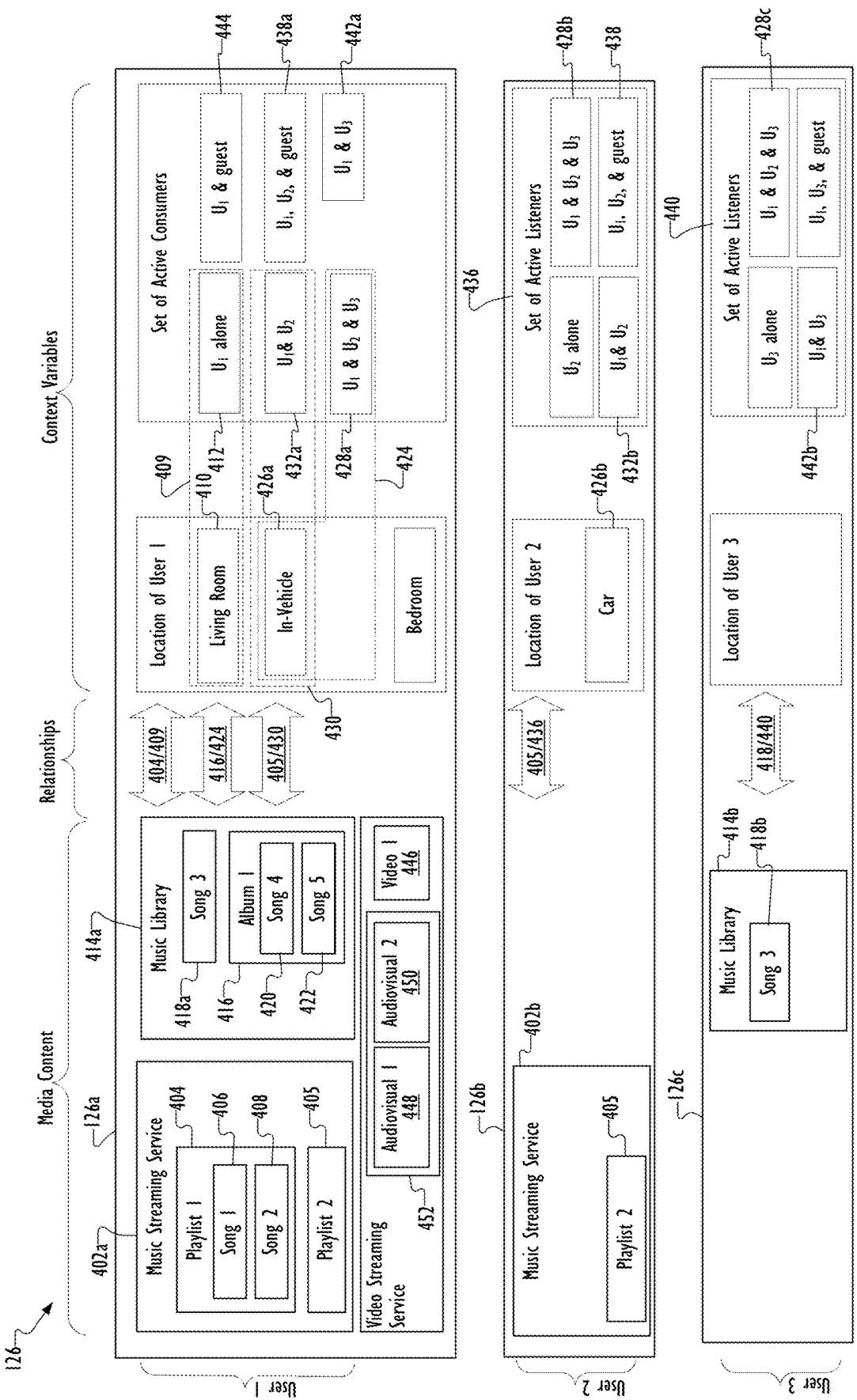
FIG. 4 illustrates components of the media preferences of electronic device of FIG. 1 or 2, in accordance with one or more embodiments.

With reference now to FIG. 4, there is illustrated components of media preferences registry 126 of electronic device 100 of FIG. 1, in accordance with one or more embodiments. Media preferences registry 126 links the specific media content to the context in which speakers 154 output the specific media content, and the context defines when to select that specific media content. Media preferences profile 1 126a corresponding to User 1 will be described as an example. It is understood that details regarding media preferences profile 1 126a apply analogously to media preferences profile 2 126b and media preferences profile 3 126c corresponding respectively to User 2 and User 3.

Home-Alone Scenario

As one example of the implementation of some aspects of the disclosure, a home-alone scenario (as presented in FIG. 5A, described below) is used to describe media preferences registry 126 shown in FIG. 4. In this home-alone scenario, ACMCS 192 may learn that when user 1 is alone in her/his living room, user 1 likes to use music streaming service 402a to consume a first playlist 404. Based on this learning, ACMCS 192 updates media preferences profile 1 126a to store a first media preference setting, which is the relationship between first playlist 404 and a context criteria 409 defined by user ID 1 122a, an active consumer state of user 1, living room location 410 of user 1, and first group designation 412 (shown as "U₁ alone"). First media preference setting is illustrated as a bidirectional arrow representing that a defined context (e.g., context criteria 409) is bidirectionally related to specific media content (e.g., first playlist 404). Music streaming service 402 includes multiple playlists (e.g., albums) and songs, including first playlist 404, and second playlist 405. First playlist 404 includes multiple songs, including first song 406 and second song 408. First group designation 412 identifies that user 1, who is associated with user ID 1 122*a*, is alone in proximity of electronic device 100 and is in an active consumer state.

In response to determining that contextual information 136 matches context criteria 409, ACMCS 192 selects first playlist 404 and triggers output device(s) 150 to output first playlist 404. ACMCS 192 updates contextual information 136 to reflect that first playlist 404 is the audio content to be output. In response to detecting that ACMCS 192 selects first playlist 404 to output, VPM 190 selects a PVL that corresponds to contextual information 136. That is, VPM 190 selects a PVL at which speaker(s) 154 output the audio component of the media content selected by ACMCS 192 (based on learned desires of user 1), by cross referencing volume preference settings 1 124*a* and media preferences profile 1 126*a* based on contextual information 136. By cross referencing, VPM 190 can determine that context criteria 409 of media preferences profile 126*a* matches context criteria linked to multiple PVLs. VPM 190 selects one PVL (e.g., 306) from the multiple matching PVLs (e.g., media content PVL 306 and living room PVL 330). In at least one embodiment, VPM 190 selects one PVL, from the multiple matching PVLs, based on highest value of the respective PVLs. In at least one embodiment, VPM 190 selects one PVL, from the multiple matching PVLs, based on the lowest value of PVL. It is understood that VPM 190 selects one PVL, from the multiple matching PVLs, based on any suitable selection criterion. As an example, when first playlist 404 contains jazz songs in a current context, and if contextual information 136 identifies media content type of audio content and also identifies jazz genre as additional PVL per media content, then VPM 190 may select jazz PVL 310 at which speaker(s) 154 output the jazz songs of first playlist 404.

Family Road Trip Scenario

Figure 6A:
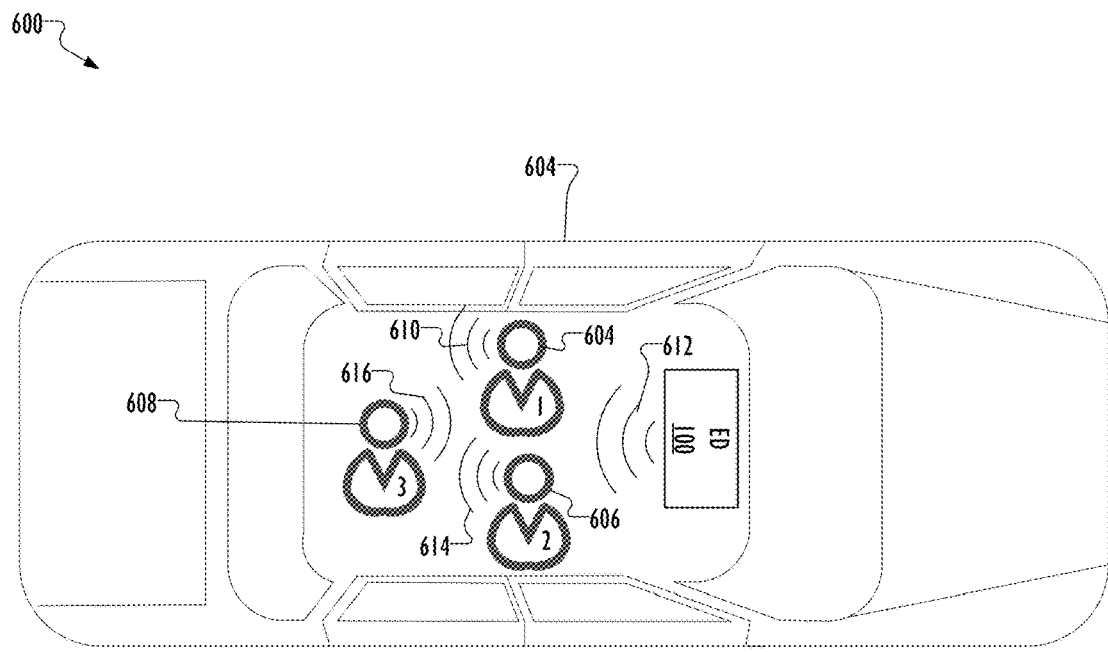
FIGS. 6A and 6B illustrates two example contexts in which the electronic device of FIG. 1 operates within a vehicle of a registered user and executes a method for operating an active consumer media content selector (ACMCS) module, in accordance with one or more embodiments.
Figure 6B:
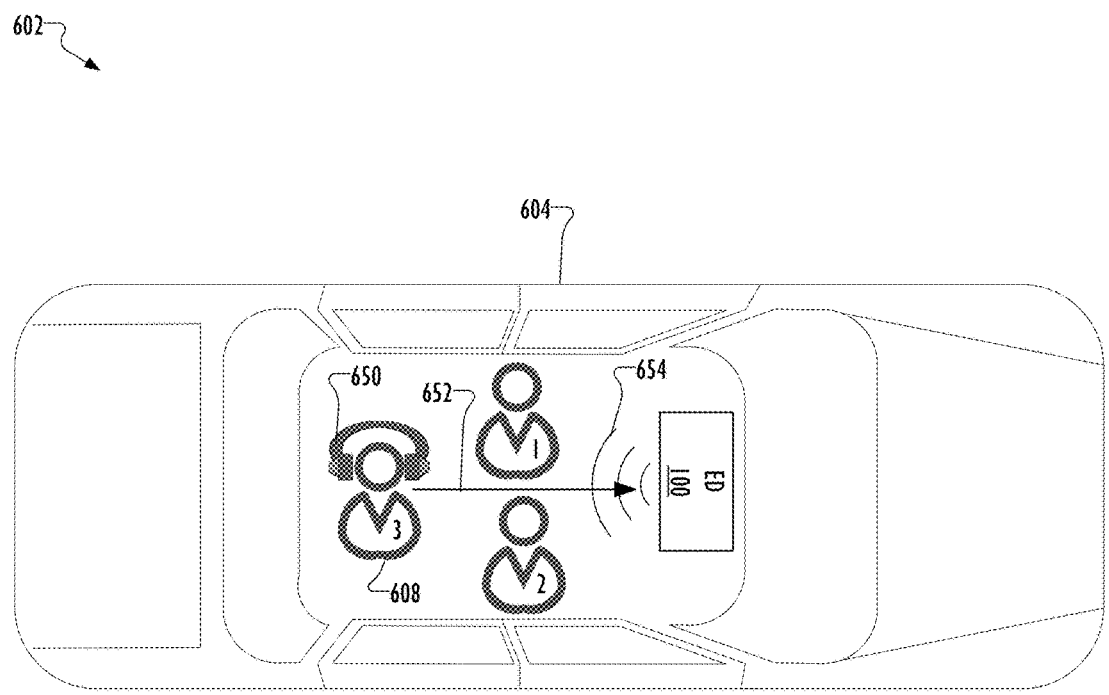

As an example illustration, a family road trip scenario is presented to aid in describing media preferences registry 126 shown in FIG. 4 and to describe operations of ACMCS 192 shown in FIGS. 6A and 6B. In this family road trip scenario, ACMCS 192 may learn that when user 1 is in her/his vehicle with family members (for example, user 2 and user 3), user 1 likes to consume (i.e., listen to) first album 1 416 from music library 414. Based on learned desires of user 1 (e.g., from previous selections by user of first album 1 416 when in a similar environment), ACMCS 192 updates media preferences profile 1 126*a* to store a second media preference setting, which is the relationship between first album 1 416 and a context criteria 424 defined by user ID 1 122*a*, an active consumer state of users 1-3, in-vehicle location 426*a* of user 1, and second group designation 428 (shown as "U$_1$ & U$_2$ & U$_3$"). Music library 414 includes multiple songs and multiple albums, including first album 416 and third song 418*a*. First album 416 includes multiple songs, including fourth song 420 and fifth song 422. Second group designation 428 identifies that users 1, 2, and 3 associated with user ID 1 122*a*, user ID 2 122*b*, and user ID 3 122*c*, respectively, are each in an active consumer state and in proximity of electronic device 100.

In this family road trip scenario, ACMCS 192 may also learn that when user 1 is in her/his vehicle accompanied by only registered user 2, then user 1 likes to use music streaming service 402 to consume second playlist 405. Based on learned desires of user 1, ACMCS 192 updates media preferences profile 1 126*a* to store a third media preference setting, which is a relationship between second playlist 405 and a context criteria 430 defined by user ID 1 122*a*, an active consumer state of users 1-2, in-vehicle location 426*a* of user 1, the location of user 2 being within a close-distance range to the location of user 1, and third group designation 432*a* (shown as "U$_1$ & U$_2$"). Third group designation 432*a* identifies that users 1 and 2, who are associated with user IDs 1-2 122*a*-122*b*, are each in an active consumer state and in proximity of electronic device 100.

In this family road trip scenario, ACMCS 192 may learn that when in a vehicle (regardless of whether alone or accompanied), registered user 2, with media preferences profile 2 126*b*, likes to use music streaming service 402*b* to consume second playlist 405. Based on learned desires of user 2, ACMCS 192 updates media preferences profile 2 126*b* to store a fourth media preference setting, which is a relationship between second playlist 405 and context criteria 436 defined by user ID 2 122*b*, an active consumer state of user 2, and in-vehicle location 426*b* of user 2. That is, for fourth media preference setting, context criteria 436 is defined in part by no group designation (i.e., null context variable value), which effectively matches any of the group designations that include user 2, namely, second group designation 428, third group designation 432, fourth group designation 438 (shown as "U$_1$, U$_2$, & guest"), and other group designations that include user 2. Fourth group designation 438 identifies that users 1 and 2, who are associated with user IDs 1-2 122*a*-122*b*, plus at least one non-registered user, are each in an active consumer state and in proximity of electronic device 100.

In this family road trip scenario, ACMCS 192 may learn that registered user 3, with media preferences profile 2 126*c*, likes to consume third song 418*b* using any content delivery source, regardless of whether alone or accompanied, and regardless of the location of user 3. Based on learned desires of user 3, ACMCS 192 updates media preferences profile 3 126*c* to store a fifth media preference setting, which is a relationship between third song 418 and a context criteria 440 defined by user ID 3 122*c*, and active consumer state of user 3. That is, for the fifth media preference setting, the context criteria 438 is defined in part by any of the group designations that include user 3, namely, second group designation 428, fifth group designation 442 (shown as "U$_1$& U$_3$"), and other group designations that include user 3.

As introduced above, media preferences profile 1 126*a* stores multiple group designations, and each of the multiple group designations is related to a different combination of registered users in proximity to the electronic device 100. In some embodiments, a context criteria 133 can be defined by sixth group designation 444 (shown as "U$_1$ & guest"), and other group designations that include user 1. Sixth group designation 444 corresponds to a context in which both registered user 1 and a non-registered user, who is along with registered user 1 and in proximity to electronic device 100, have active consumer state.

In at least one embodiment, VPM 190 and/or ACMCS 192 assigns a priority to each group designation of active consumers relative to each other group designation. A priority assignment enables VPM 190 to select one PVL when multiple matching PVLs (i.e., matching the contextual information 136) are identified, and enables ACMCS 192 to select one media preference setting from among multiple matching media preference settings. In at least one embodiment, priority is pre-assigned to each group designation based on which active consumer(s) is in the group. Example priority assignments include: (i) volume preference settings 124a of user 1 always ranks higher than volume preference settings 124c of user 3; (ii) volume preference settings 124a of user 1 only ranks higher than volume preference settings 124b of user 2 in a specific context, such as when contextual information 136 indicates an in-vehicle location of users 1 and 2; and (iii) media preference profile 1 126a of user 1 has an equal priority rank as media preference profile 1 126b of user 2. In at least one embodiment, when a set of volume preference settings (124a of user 1) has a higher rank than another set of volume preference settings (124c of user 3), VPM 190 selects a PVL from the set of volume preference settings (124a of user 1) that has the higher ranking priority assignment. In at least one embodiment, when a media preference profile (e.g., 126a of user 1) has a higher priority ranking than another media preference profile (e.g., 126b of user 2), ACMCS 192 outputs specific media content identified in the higher ranked media preference profile without outputting specific media content identified in the lower ranked media preference profile. In at least one other embodiment, when multiple media preference profiles have an equal priority ranking, ACMCS 192 alternates between outputting specific media content identified in each of the multiple media preference profiles that have the equal priority ranking. For example, ACMCS 192 outputs a specific media content identified in media preference profile 1 126a, followed by outputting a specific media content identified in media preference profile 2 126b, followed by again outputting another specific media content identified in media preference profile 1 126a.

It is understood that any context criteria 129, 133 (regardless of being part of volume preference registry 124 or media preferences registry 126) can be defined by the context variable. The context variable is named for identification and location of a person(s) in a coverage space in proximity to electronic device 100. As such, any context criteria 129, 133 can be assigned a context variable value selected from: (general) alone designation 304 (FIG. 3), (general) group designation 336 (FIG. 3), or any of the (specific) group designations of FIG. 4 (i.e., first through sixth group designations 412, 428, 432, 438, 442, 444). For example, the context criteria 129 linked to voice reply PVL 302a (FIG. 3) can be defined by the general alone designation 304 or defined by the specific first group designation 412 (shown as "U₁ alone"). If, for instance, user 1 is alone in proximity to electronic device 100 and listening to a voice reply, then the context criteria 129 defined in part by the specific first group designation 412 will match contextual information 136 only if contextual information 136 identifies both that user 1 associated with user ID 122a is present and in an active consumer state. But, if the context criteria 129 is defined in part by the (general) alone designation 304, then a match for context criteria 129 will occur when contextual information 136 identifies that user 1 associated with user ID 122a is present, regardless of whether contextual information 136 contains active consumer/non-consumer state information about user 1.

Media preferences registry 126 is not limited to specific media content identifiers (SMC-IDs), such as SMC-ID 131, that identify audio content type of media content. In some embodiments, media preference profile 1 includes a media preference setting that provides a relationship between a context criteria 133 and an SMC-ID 131 that identifies a silent film as "Video 1" 444 in FIG. 4. Video 1 446 represents video-only type media content that is output by display 152, from which the user(s) consumes (i.e., watches) the content. In some embodiments, media preference profile 1 includes a media preference setting that provides a relationship between a context criteria 133 and an SMC-ID 131 that identifies a video, "Audiovisual 1" 448, which is part of a playlist 452 of multiple videos that includes Audiovisual 1 448 and "Audiovisual 2" 450. Each of the multiple videos (448 and 450) of the playlist 452 represents an audiovisual type media content that is output by both display 152 and speaker(s) 154, from which the user(s) consumes (i.e., watches and listens to, respectively) the content.

Figure 5A:
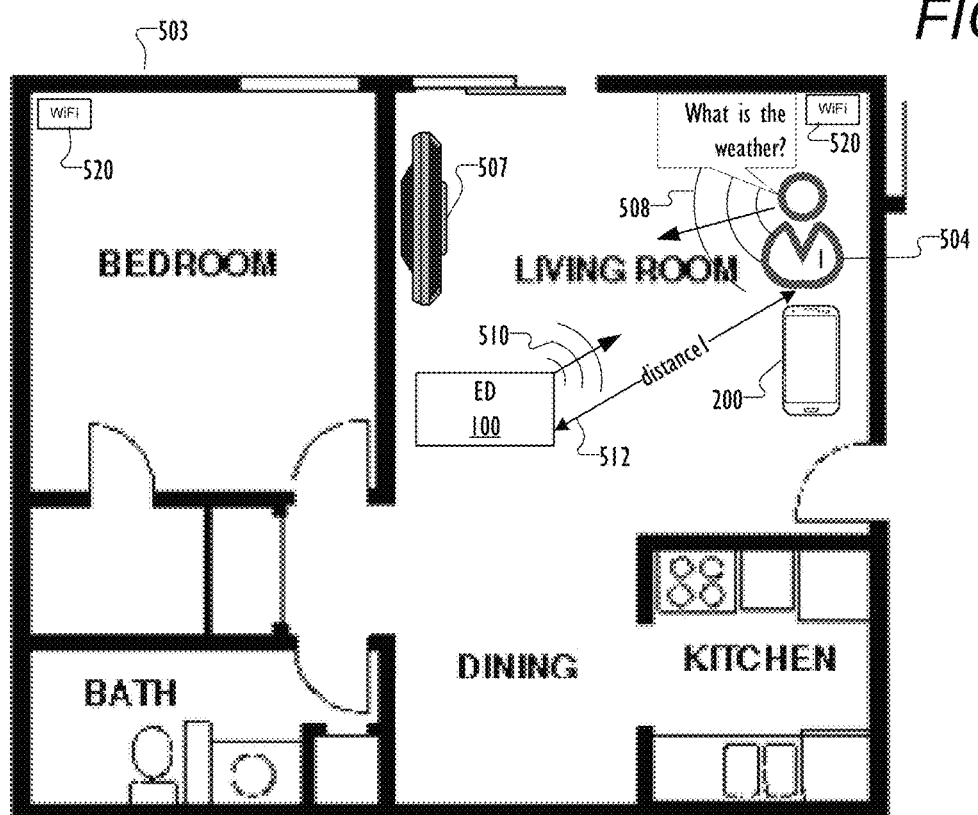
FIGS. 5A-5C illustrate three example contexts in which electronic device of FIG. 1 operates within the coverage space of a home of at least one registered user and performs context-based volume adaptation, in accordance with one or more embodiments.
Figure 5B:
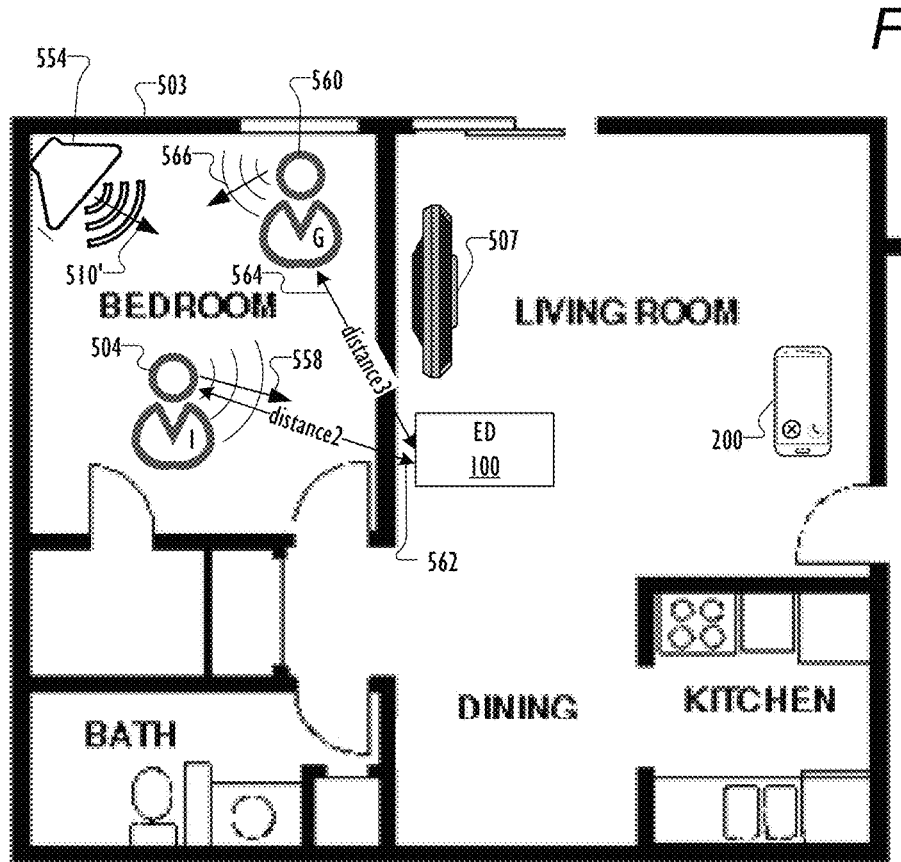

With reference now to FIGS. 5A and 5B, there are illustrated two example contexts 500 (FIG. 5A) and 502 (FIG. 5B) in which electronic device 100 of FIG. 1 operates within a first coverage space 503, that is presented herein as a home of a registered user, and performs context based volume adaptation, in accordance with one or more embodiments. In the particular examples shown in FIGS. 5A and 5B, first coverage space 503 is the home of a first registered user 504. As a home, first coverage space 503 is a fully enclosed area with walls, doors, windows, a floor, and a ceiling that define the boundary of the space. For simplicity, first coverage space 503 may be more generally referred to as home (with or without reference numeral 503). More generally, in this disclosure, the listening capabilities of electronic device 100 have a finite coverage area that is limited to a three-dimensional (3D) physical space that is referred to as its "coverage space." It is understood that in some embodiments, a coverage space can be an indoor or outdoor space, which may include, for example, one or more fully or partially enclosed areas, an open area without enclosure, etc. Also, a coverage space can be or can include an interior of a room, multiple rooms, a building, or the like. In FIGS. 5A and 5B, electronic device 100 represents a smart speaker that is located in the living room of the home of first registered user 504. First registered user 504 is the owner of multiple electronic devices, including electronic device 100 and mobile device 200 (FIG. 2) and network-connected television 507. First registered user 504 is a registered user of both electronic device 100 and mobile device 200, each of which uses user ID 1 122a to identify first registered user 504 as a registered user of the respective device. That is, first registered user 504 correlates to user ID 1 122a of FIG. 1. Electronic device 100 and mobile device 200 can connect to and communicate with each other via network 170 (FIGS. 1 and 2).

In FIG. 5A, there is illustrated an example living room context 500 in which electronic device receives an input, which triggers VA 113 to perform a task that comprises outputting audio content 510 through speaker 154 associated with electronic device 100. For example, first registered user 504 initiates a dialogue with VA 113 by verbally asking a question "What is the weather?" Microphone 142 receives user input 508 in the form of sound from the voice of first registered user 504. Based on user input 508, VA 113 determines the input is from first registered user 504 and that the intent of first registered user 504 is for VA 113 to perform a task of retrieving information (such as weather forecast data) from remote server 180, generating a response (such as a verbal summary of the weather forecast) based on the retrieved information, and reading aloud the response as audio content 510.

VPM 190 determines a current context is living room context 500 and selects the volume level at which speaker(s) 154 will output audio content 510, based on contextual information 136 that electronic device 100 obtains from current context 500. More particularly, VPM 190 either selects, based on contextual information 136, a PVL specified within volume preference registry 124 or selects current volume level 136. When contextual information 136 includes a context variable value indicating that electronic device 100 is being operated by a non-registered user while no registered user is present in proximity to electronic device 100, VPM 190 selects current volume level 136 for speakers(s) 154 to output audio context 510. Alternatively, when contextual information 136 includes an identifier (such as one of user IDs 1-3 122*a*-122*c*) of at least one registered user who is present in proximity to electronic device 100, VPM 190 searches to find a context defined within volume preference registry 124 that matches contextual information 136. When contextual information 136 matches a context defined in the volume preference registry 124, VPM 190 selects the PVL corresponding to the matched context.

In the example living room context 500, VPM 190 does not select current volume level 136. As described more particularly below, VPM 190 determines that contextual information 136 corresponding to living room context 500, which matches a context defined in set of preferred volume settings 1 124*a* and specified by at least one of the following: voice reply PVL 302*a*, television PVL 320*a*, or living room PVL 330*a*. As a result, VPM 190 selects the PVL corresponding to the matched context, which is voice reply PVL 302*a*. That is, in the context 500, electronic device 100 outputs audio content 510 via speaker 154 at voice reply PVL 302*a* selected from set of volume preference settings 1 124*a* of first registered user 504, based on contextual information 136 of living room context 500.

According to the above description of volume preference registry 124 (FIG. 3), various contexts defined in each user-specific set of volume preference settings 124*a*-124*c* have multiple context variables. In order for contextual information 136 to describe the current context, electronic device 100 performs multiple detections, determinations, and identifications that obtain values related to the multiple context variables. By obtaining values related to the multiple context variables, electronic device 100 is able to generate contextual information 136 that more completely describes the current context. This process results in an identification of a current context, which is more likely to match a context defined in the volume preference registry 124.

Electronic device 100 identifies a type of the audio content 510 to be outputted through the speaker(s). Electronic device 100 is able to identify the type of the audio content 510 as either a voice reply type of audio content or a media content type of audio content. In this example living room context 500, electronic device 100 identifies audio content 510 as the voice reply type, and electronic device 100 updates contextual information 136 to reflect that the current living room context 500 includes voice reply type of audio content.

In some embodiments, electronic device 100 further identifies "weather" as the topic of the voice reply type of audio content 510. Electronic device 100 can identify topics of voice replies based on keywords (e.g., "weather") within user input 408 or based on a topic indicator received from remote server 180. For example, weather forecast data, which remote server 180 sends to electronic device 100, could include weather application service ID 186. Electronic device 100 determines that weather is the topic of voice reply type of audio content 510 by using weather application service ID 186 as a topic indicator. Electronic device 100 updates contextual information 136 to reflect that the current context includes weather as the topic of voice reply type of audio content 510.

Electronic device 100 determines whether at least one registered user of electronic device 100 is present in proximity to the electronic device 100. In making this determination, electronic device 100 can also identify which registered user(s) of electronic device 100 is present in proximity to the electronic device 100. Electronic device 100 can employ various techniques to determine that first registered user 504 is in proximity to electronic device 100. For example, electronic device 100 can detect the presence of first registered user 504 by using credentials authenticator 132 to detect that the voice within user input 508 matches the voice ID of user ID 122*a*. Electronic device 100 can detect the presence of first registered user 504 by using credentials authenticator 132 and camera 145 to detect that a face within the field of view of camera 145 matches the face ID of the user associated with user ID 122*a*. Electronic device 100 can infer the presence of first registered user 504 by detecting that mobile device 200, which belongs to first registered user 504, is connected the same local network (e.g., in-home LAN) to which electronic device 100 is connected. In one embodiment, detection by electronic device 100 of the user's mobile device 200 can be used to as a trigger to initiate (or to confirm) other means of authenticating that the first registered user 504 is indeed present in the room/coverage space 503.

Electronic device 100 can employ similar techniques to determine whether multiple registered users, including first registered user 504 and at least one second registered user (e.g., registered users 606 and 608 shown in FIG. 6A) are present in proximity to electronic device 100. In living room context 500, electronic device 100 updates contextual information 136 to include user ID 1 122*a* indicating that first registered user is present in proximity to electronic device 100. Electronic device 100 further updates contextual information 136 to include alone designation 304 based on the determination that no other person is present in home 503. When VPM 190 determines that contextual information 136 corresponding to living room context 500 matches context defined in voice reply PVL 302*a*, VPM 190 selects the PVL corresponding to voice reply PVL 302*a* to output audio context 510 via speakers(s) 154. Electronic device 100 outputs audio content 510 via speaker(s) 154 at the selected value of preferred volume level specified by (e.g., comprised in) voice reply PVL 302*a*. In some embodiments, when electronic device 100 does not detect the presence of a concurrent consumer (i.e., registered or non-registered user) in proximity to electronic device 100 along with first registered user 504, electronic device 100 only selects a PVL that does not correspond to a group designation 336, or otherwise refrains from selecting any PVL that corresponds to a group designation 336.

In some scenarios, electronic device 100 determines that no registered user is present in proximity to electronic device 100. In one such scenario, first registered user 504 is not inside home 503. Instead, a non-registered user is located inside of home 503 and initiates a dialogue with VA 113 by verbally asking the question "What is the weather?" In another scenario, first registered user 504 is not inside home 503 and the face of non-registered user located inside home 503 is detected in the field of view of camera 145. In these two example scenarios, the non-registered user has provided input received at electronic device 100, but credentials authenticator 132 determines that none of the inputs includes credential data that matches any of the user IDs 122a-122c within users registry 122. VA 113 generates a response to questions asked by or requests made by the non-registered user, and VA 113 reads aloud the response as audio content 510. However, because no registered user is present in proximity to electronic device 100, VPM 190 causes electronic device 100 to output audio content 510 via speaker 154 at current volume level 138.

Contextual information 136 includes context variable value(s) indicating the location of first registered user 504. Electronic device 100 (e.g., using GPS sensor 146) or mobile device 200 using GPS MOD 258 (FIG. 2) or signal triangulation) determines the location of first registered user 504. The user's location can be a geographical location, such as the same geo-coordinates as the geographical location of home 503. Additionally, electronic device 100 more specifically determines where, within home 503, registered user 504 is located relative to the location of electronic device 100. For example, electronic device 100 determines the direction from which the voice signal of user input 508 was received by an omnidirectional microphone (142). Electronic device 100 uses input devices 140, such as proximity sensor(s) 148, to determine (e.g., measure or estimate) a first distance (shown as "distance1") between first registered user 504 and electronic device 100. In FIG. 5A, the location of first registered user 504 within home 503 relative to the location of electronic device 100 is illustrated by the direction and length of first-location and distance arrow 512. First-location and arrow 512 has a length representative of the first distance (distance1). As an example, based on GPS positioning or WiFi-triangulation using in-home WiFi (wireless fidelity) devices 520, electronic device 100 knows that electronic device 100 is in the living room within home 503. Electronic device 100 determines that the location of first registered user 504 is also in the living room, by comparing and ascertaining that first distance (distance1) does not exceed a close distance range from the known location of electronic device 100, which is located in the living room. When VPM 190 determines that contextual information 136 corresponding to living room context 500 matches context defined in living room PVL 330a, VPM 190 sets speakers(s) 154 to output audio context 510 at the PVL corresponding to living room PVL 330a. Electronic device 100 outputs audio content 510 via speaker(s) 154 at the selected value of preferred volume level specified by living room PVL 330a.

With the present example, electronic device 100 and television 507 are connected to each other via network 170 (FIG. 1). More particularly, each of electronic device 100 and television 507 can self-report state information to remote server 180 via network 170. For example, remote server 180 receives, from television 507, state information indicating whether television 507 is in a MUTED state or in the AUDIBLE state. In living room context 500, when speakers of television 507 are outputting sound, television 507 is in the AUDIBLE state. Electronic device 100 detects television background noise via microphones 142. Electronic device 100 independently determines that television 507 is in the AUDIBLE state based on the detected television background noise. Electronic device 100 updates contextual information 136 based on the independently determined AUDIBLE state of television 507. In some embodiments, electronic device 100 can dependently determine that television 507 is in the AUDIBLE state based on state information (e.g., information indicating the AUDIBLE state of television 507) received from remote server 180 via network 170. In living room context 500, when electronic device 100 receives the state information indicating the AUDIBLE state of television 507, VPM 190 and/or ACMCS 192 updates contextual information 136 based on the received state information. When VPM 190 determines that contextual information 136 corresponding to living room context 500 matches the context defined in television PVL 320a, VPM 190 sets speakers(s) 154 to output audio context 510 at the PVL corresponding to television PVL 320a. Electronic device 100 outputs audio content 510 via speaker(s) 154 at the selected value (e.g., within range of high volume levels 8-10) of preferred volume level specified by or included in television PVL 320a.

If first registered user 504 moves from the living room to a second location (e.g., the bedroom) in a different room within home 503, electronic device 100 updates contextual information 136 based on the differences between current context, other room context 502 (FIG. 5B) and previous context, living room context 500 (FIG. 5A). Based on machine learning, VPM 190 knows that first registered user 504 likes to hear voice replies at different volume levels depending on the location of the user in the house, namely, depending on which room (e.g., living room, bedroom) the user is located in. In FIG. 5B, there is illustrated an example current context that is "other room" context 502 (i.e., not the living room context 500) in which the electronic device is located in a different room). In other room context 502, electronic device 100 receives an input that triggers VA 113 to perform a task that comprises outputting audio content 510' through an external speaker 554 associated with electronic device 100. Audio content 510' is the same as audio content 510 (FIG. 5A), except that audio content 510' is outputted by external speaker 554 rather than speakers 154, which are internal device speakers. External speaker 554 is similar to and performs the same or similar functions as speaker(s) 154 (FIG. 1). External speaker 554 is communicably coupled to electronic device 100 by wired or wireless connection and controlled by I/O controllers 130 (FIG. 1).

In other room context 502, first registered user 504 initiates a dialogue with VA 113 by verbally asking a question "What is the weather?" Microphone 142 receives user input 558 in the form of sound from the voice of first registered user 504. Based on user input 558, VA 113 determines the user intent of first registered user 504 is for VA 113 to perform a task of reading aloud a response that includes a verbal summary of a weather forecast, presented as audio content 510'.

VPM 190 selects which volume level speaker 554 will output audio content 510', based on contextual information 136 that electronic device 100 obtains from other room context 502. In the example other room context 502, VPM 190 does not select current volume level 136. As described more particularly below, VPM 190 determines that contextual information 136 corresponding to current context, other room context 502, matches a context defined in set of preferred volume settings 1 124a and specified by at least one of the following: voice reply PVL 338, media content PVL 340, bedroom/other room PVL 328, and second phone call PVL 348a.

In obtaining contextual information based on other room context 502, electronic device 100 identifies which registered user(s) of electronic device 100 is present in proximity to the electronic device 100. Electronic device 100 infers the presence of first registered user 504 by detecting that mobile device 200, which belongs to first registered user 504, is connected to the same local network (e.g., in-home LAN) to which electronic device 100 is connected. Electronic device 100 detects the presence of first registered user 504 by using credentials authenticator 132 to detect that the voice within user input 558 matches the voice ID of the user associated with user ID 122a. In some embodiments, electronic device 100 uses the voice ID match detected by credentials authenticator 132 to confirm the inference about the presence of first registered user 504.

Electronic device 100 determines whether at least one non-registered, other user is also present in proximity to electronic device 100 along with first registered user 504. Particularly, in other room context 502, electronic device 100 (e.g., using microphone 142 and/or camera 145) detects the presence of non-registered user 560 is in proximity to electronic device 100 along with first registered user 504. Electronic device 100 can employ various techniques to determine the presence of non-registered user 560. For example, electronic device 100 can employ passive listening techniques to determine whether non-registered user 560 is in proximity to electronic device 100. As another example, electronic device 100 can employ biometric voice recognition techniques to infer the presence of non-registered user 560. The inference is based on no matching voice being detected when biometric characteristics of the voice of non-registered user 560 are compared to known biometric voice characteristics in registered voice IDs/user IDs within user registry 122. In other room context 502, electronic device 100 receives audio input 566 containing sounds of the voice of non-registered user 560, and electronic device 100 applies the passive listening and biometric voice recognition techniques to audio input 566. When output resulting from the application of the passive listening and biometric voice recognition techniques indicates that non-registered user 560 is present in proximity to electronic device 100, electronic device 100 updates contextual information to include an indicator of the presence of the non-registered user 560. Based on these updates, VPM 190 determines that contextual information 136 corresponding to current context 502 includes group designation 336.

In one example, obtaining contextual information 136 based on current context, i.e., other room context 502, electronic device 100 additionally identifies audio content 510' as the voice reply type. Electronic device 100 updates contextual information 136 to reflect that the current context (other room context 502), includes voice reply type of audio content. In sum, based on these updates, VPM 190 determines that contextual information 136 corresponding to current context 502 identifies (i) the voice reply type of audio content, (ii) user ID 1 122a indicating the presence of first registered user 504, and (iii) group designation 336. When VPM 190 determines that contextual information 136 corresponding to other room context 502 matches context defined in voice reply PVL 338a, VPM 190 sets speaker 554 to output audio context 510' at the value of PVL corresponding to voice reply PVL 338a. Electronic device 100 outputs audio content 510' via speaker(s) 554 at the selected value of PVL specified by voice reply PVL 338a.

Contextual information 136 includes context variable value(s) indicating the location of first registered user 504, the location of non-registered user 560, and a determination of whether non-registered user 560 is in the same room as first registered user 504. Electronic device 100 uses input devices 140 to determine the location of first registered user 504 within home 503 relative to the location of electronic device 100. The location of first registered user 504 is illustrated in FIG. 5B by the direction and length of second-location arrow 562, which has a length representative of the second distance (distance2). Electronic device 100 determines that the location of first registered user 504 is in the bedroom based on the direction from which the voice signal of user input 558 was received by an omnidirectional microphone (142). Electronic device 100 updates contextual information 136 to identify that the location of first registered user 504 is in the bedroom within home 503.

Using similar techniques, electronic device 100 determines the location of non-registered user 560. The location is illustrated in FIG. 5B by the direction and length of third-location arrow 564, which has a length representative of the third distance (distance3). Electronic device determines that first registered user 504 and non-registered user 560 are located in the same room as each other based on a determination that the directions of second-location arrow 562 and third-location arrow 564 are within a close range. When VPM 190 determines that contextual information 136 corresponding to other room context 502 matches context defined in same-room PVL 344a, VPM 190 sets speaker 554 to output audio context 510' at the PVL corresponding to same-room PVL 344a. Electronic device 100 outputs audio content 510' via speaker(s) 554 at the selected value of PVL specified by same-room PVL 344a. That is, VPM 190 updates current volume 138 to the selected value of PVL specified by same-room PVL 344a.

Based on machine learning, VPM 190 knows that first registered user 504 likes to hear voice replies louder when the user is located in the bedroom (i.e., a different room than the location of the electronic device 100) than when the user is located in the living room. Accordingly, in at least one embodiment, VPM 190 further updates current volume 138 to a value that is greater than a known PVL that corresponds to a living room context in which first registered user 504 is in the living room (i.e., a same room as the location of electronic device 100). For example, VPM 190 updates current volume 138 to a value that is greater than living room PVL 330a (FIG. 3). Similarly, in at least one embodiment, VPM 190 updates current volume 138 to a value that is the same as or similar to a known PVL (e.g., bedroom PVL 328a) that corresponds to a context in which first registered user 504 is the bedroom.

In other room context 502, electronic device 100 and mobile device 200 are connected to and/or can communicate with each other via network 170 (FIG. 1). In context 500, electronic device 100 receives, from server 180, state information indicating the CALL state (as introduced above to aid in describing second phone call PVL 348a of FIG. 3). The CALL state is represented in FIG. 5B by decline and accept buttons on the touchscreen of mobile device 200. Electronic device 100 updates contextual information 136 based on the received state information. When VPM 190 determines that contextual information 136 corresponding to current context 502 matches context defined in second phone call PVL 348a, VPM 190 sets speaker 554 to output audio context 510' at the PVL corresponding to second phone call PVL 348a. Electronic device 100 outputs audio content 510' via speaker(s) 554 at the selected value of PVL specified by second phone call PVL 348a.

In at least one embodiment, electronic device 100 utilizes ACMCS 192 to identify whether first registered user 504 is in an active consumer state or a non-consumer state. ACMCS 192 updates contextual information 136 to include an applicable group designation based on the determined active consumer or non-consumer state of the registered user associated with first user ID 122a. For example, ACMCS 192 updates contextual information 136 to include sixth group designation, user and guest group 444 (FIG. 4), based on current context 502. VPM 190 is able to select a PVL that corresponds to contextual information 136 that has been updated to include sixth group designation, user and guest group 444.

According to one aspect of the disclosure, ACMCS 192 adapts media content dynamically based on which people are actively consuming the media content at any given time. More particularly, ACMCS 192 selectively outputs media content associated with a media preferences profile 126a-126c of each registered user that is detected within proximity of electronic device 100 and in an active consumer state.

Shared-Television Scenario

Figure 5C:
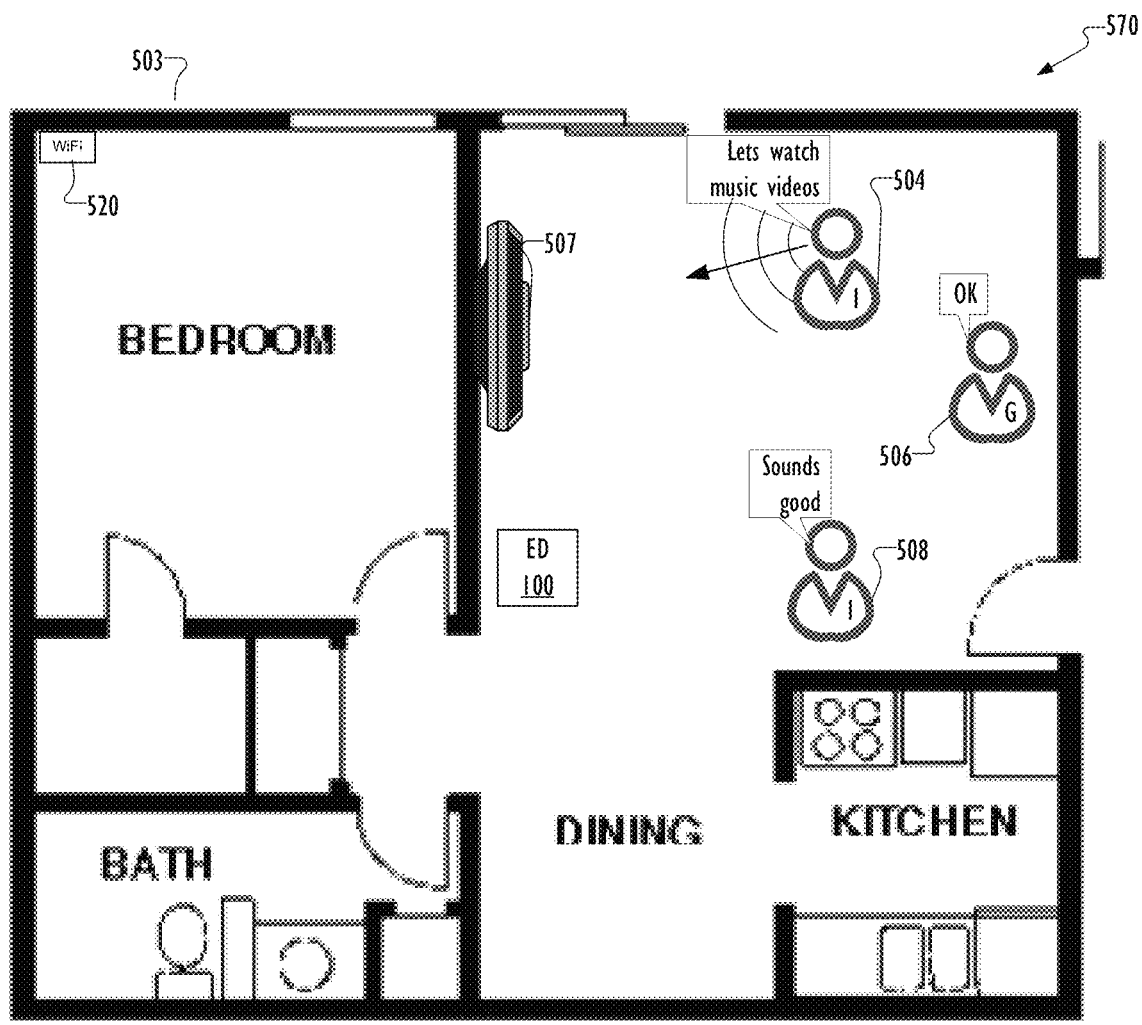

As an example illustration, a shared television scenario is presented in FIG. 5C to aid in describing user experiences that will be improved by operations of ACMCS 192 In this shared-television scenario, three family members (for example, first registered user 504, second registered user 506, and third registered user 508) are together, in the same room at home, watching videos together on a single television, which may be represented by display 152 (FIG. 1). As it is very common, the three family members have quite different interests from each other. The first, second, and third family members may prefer to watch videos from music video A, B, and C, respectively. Each of the family members believes it is important to be together, so they may agree to watch several music videos, shuffling between selections by each person.

By shuffling, one family member takes a turn to choose a video that everyone watches, then another family member takes a turn to choose a subsequent video that everyone watches. Any family member who falls asleep, departs the room, or otherwise stops consuming the media content (i.e., stops watching the videos), will lose her/his turn to choose a video, but only if someone notices that s/he has stopped consuming the media content. While the "inactive" (i.e., asleep/departed) family member(s) sleeps or remains absent, the remaining two family members shuffle between videos that the remaining two want to watch. When the asleep/departing family member awakens/returns, s/he is allowed to rejoin the shuffling by taking a turn to select a video that everyone watches on the television.

ACMCS 192 enables the registered users 504, 506, 508 to collectively have an improved user experience by automating the selection of content based on the detected states of each of the registered users 504, 506, 508. With ACMCS 192 the users 504, 506, 508 do not have to: (i) take turns manually (or by voice command) selecting a video from different content delivery platforms, or (ii) take time to log in to different subscription accounts owned by different family members, or (iii) take time to think about whose turn is next or whose turn is lost/reinstated, for selecting a next video to watch. The ACMCS-provided family experience thus also results in saving one or more of the family members time and effort in selecting the video content. As one example, the family uses ACMCS 192 to automatically and/or dynamically select specific media content (e.g., music videos A, B, and C) based on a determination of who is actively consuming the media content and based on learned preferences of the present, actively consuming family member(s).

Family Road Trip Scenario II

A similar kind of scenario is shown in the contexts 600 and 602 of FIGS. 6A and 6B, in which the Family road trip scenario (introduced above to describe media preferences registry 126 of FIG. 4) is used to describe operations of ACMCS 192. In the family road trip scenario, as described more particularly below, ACMCS 192 applies the learned user desires (e.g., media preference settings stored in media preferences registry 126 of FIG. 4) to contexts 600 and 602.

With reference now to FIGS. 6A and 6B, there are illustrated two example contexts 600 (FIG. 6A) and 602 (FIG. 6B) in which electronic device 100 of FIG. 1 operates within a second coverage space 604 that is a vehicle of a registered user and executes a method (i.e., method 800 of FIG. 8) for operating ACMCS 192, in accordance with one or more embodiments. In the particular examples shown in FIGS. 6A and 6B, second coverage space 604 is the vehicle of a first registered user 504.

As shown in FIG. 6A, three family members, namely, first registered user 604 who is associated with media preferences profile 126a, second registered user 606 who is associated with media preferences profile 126b, and third registered user 608 who is associated with media preferences profile 126c, are together, in second coverage space 604, (i.e., the passenger cabin of a vehicle). For simplicity, second coverage space 604 may be more generally referred to as car 604. It is understood that inside a vehicle, electronic device 100 can represent mobile device 200 (FIG. 2) carried into car 604 by a registered user, or represent an infotainment system, which is an integral component of the vehicle. For illustration purposes, infotainment system can be generally represented as electronic device 100. Similarly, speakers and displays that are integral components of the vehicle can be associated with (e.g., coupled to) electronic device 100 and controlled by I/O controllers 130 (FIG. 1) as display(s) 152 and speaker(s) 154.

In a first example, first registered user 604 initiates a dialogue with VA 113 by orally requesting "Play Beyoncé." Microphone 142 receives user input 610 in the form of sound from the voice of first registered user 604. Based on user input 610, VA 113 determines the user intent of first registered user 604 is for VA 113 to perform the tasks of (i) retrieving information (such as artistic works performed by a specific artist named Beyoncé) from remote server 180 or locally stored music cache and (ii) playing back the retrieved information as media content 612.

ACMCS 192 detects the presence of first registered user 604 in proximity to electronic device 100. For example, ACMCS 192 may detect the presence based on matching voice characteristics within user input 610 to a voice ID associated with user ID 122a. ACMCS 192 detects the presence of second and third registered users 606 and 608 in proximity to the electronic device 100. This detection may be achieved, for example, by applying passive listening techniques to audio input received from one or more registered users. That is, when second and third registered users 606 and 608 speak words, their voices generate audio inputs 614 and 616 that are detected/received by ACMCS 192. ACMCS 192 can apply biometric voice recognition to identify that passively-detected audio inputs 614 and 616 contain the voices of second and third registered users 606 and 608, respectively. ACMCS 192 updates contextual information 136 to indicate the presence of a plurality of registered users, including registered users associated with user IDs 1-3 122a-122c within proximity to electronic device 100.

For each detected registered user, ACMCS 192 determines whether the detected registered user is an active consumer. ACMCS 192 is programmed to deduce that whenever the voice of a person is detected, the person is awake. Thus, ACMCS 192 determines that first, second, and third registered users 604, 606, and 608 are in an active consumer state based on the determination that user input 610 and audio inputs 614 and 616 each contains at least one word. In at least one embodiment, ACMCS 192 updates contextual information 136 to indicate the active consumer state of each of the registered users associated with user IDs 1-3 122a-122c.

In at least one embodiment, ACMCS 192 determines whether the detected registered user is an active consumer or a non-consumer based on an active-consumer/non-consumer state of the detected registered user. The active-consumer state indicates the detected registered user is an active consumer, and the non-consumer state indicates that the detected registered user is a non-consumer. In some embodiments, ACMCS 192 determines whether the detected registered user is an active consumer or a non-consumer based on an awake/asleep state of the detected registered user. The awake state indicates the detected registered user is in the active-consumer state, and is an active consumer. The asleep state indicates the detected user is in the non-consumer state, and is a non-consumer. In at least one embodiment, ACMCS 192 determines an active-consumer/non-consumer (e.g., awake/asleep) state of the detected registered user that provides contextual details associated with the active-consumer/non-consumer state of the passengers in the vehicle. In some embodiments, ACMCS 192 determines the active-consumer/non-consumer state based on audio input 614 and 616 received by the microphone 142. For example, audio input 614 can include speech ("[name of registered user 3] is asleep." or "[name of registered user 1] woke up" or "[Name of registered user 3] is wearing headphones?") of second registered user 606 and includes words describing whether first or third registered user 604, 608 is in the active-consumer state (e.g., awake state) or in the non-consumer state (e.g., asleep state). Similarly, audio input 616 can include speech of third registered user 608 that includes words describing whether first or second user 604, 606 is in the active-consumer state or in the non-consumer state (e.g., "[name of registered user 1] is asleep." or "[name of registered user 2] woke up" or "[name of registered user 2] took her/his headphone off."). ACMCS 192 can use keyword spotting to detect keywords that indicate the non-consumer state, such as the name of third registered user 608 together with the word "asleep" or phrase "wearing headphones." ACMCS 192 can use keyword spotting to detect keywords that indicate the active-consumer state, such as the name of first registered user 604 together with the word "woke" or phrase "headphones off." In at least one embodiment, ACMCS 192 determines an awake/sleep state of the detected registered user based on audio input received by an indication from a wearable device (e.g., smartwatch, wearable fitness tracker, wearable sleep monitor) indicating whether the at least one present registered user is in the awake state or the asleep state.

In response to determining that at least one second registered user 608, 610 is also present in proximity to electronic device 100 along with first registered user 604, ACMCS 192 assigns one of multiple group designations to contextual information 136 identifying which registered users are in proximity to the electronic device. The group designation indicates that the plurality of registered users is consuming the audio content. More particularly, ACMCS 192 assigns second group designation 428 (shown as "U$_1$ & U$_2$ & U$_3$" in FIG. 4) to contextual information 136.

For each active consumer, ACMCS 192 selects, from media content linked to the user ID of the active consumer, a specified type of media content based on contextual information 136 that matches a predefined set of active consumers defined in media preference setting of the active consumer. For first registered user 604, ACMCS 192 selects first album 416, which is a specific type of media content (i.e., audio content), and is itself a specific media content. ACMCS 192 searches media preference profile 1 126a for a media preference setting that matches second group designation 428 within contextual information 136 (corresponding to current context 600). As a result of the search, ACMCS 192 identifies second media preference setting, which includes context criteria 424 that is defined in part by second group designation 428. That is, context criteria 424 matches contextual information 136 (corresponding to current context 600). Based on the matching of context criteria 424, ACMCS 192 selects first album 416, which is linked to context criteria 424 of the second media preference setting. Similarly, for second registered user 608, ACMCS 192 searches media preference profile 2 126b for a media preference setting that matches second group designation 428 within contextual information 136 (corresponding to current context 600). As a result of the search, ACMCS 192 identifies fourth media preference setting, which includes no group designation (i.e., null context variable value for the group designation) within the context criteria 436. Within media preference profile 2 126b, "no group designation" effectively matches any of the group designations that include second registered user 606 (i.e., user 2). That is, ACMCS 192 identifies that context criteria 436 matches contextual information 136 (corresponding to current context 600). Based on the matching of context criteria 436, ACMCS 192 selects second playlist 405, which is linked to context criteria 436 of the fourth media preference setting. Similarly, for third registered user 610, ACMCS 192 searches media preference profile 3 126c for a media preference setting that matches second group designation 428 within contextual information 136 (corresponding to current context 600). As a result of the search, ACMCS 192 identifies fifth media preference setting, which includes no group designation within the context criteria 440. Within media preference profile 3 126c, the no group designation effectively matches any of the group designations that include third registered user 608 (i.e., user 3). That is, as a result of the search, ACMCS 192 identifies that context criteria 440 matches contextual information 136 (corresponding to current context 600). Based on the matching of context criteria 440 of fifth media preference setting, ACMCS 192 selects third song 418, which is linked to context criteria 440 of the fifth media preference setting.

ACMCS 192 outputs, via output device(s) 150, the selected specific media content 612 associated with the media preferences profile of the detected registered user(s). In at least one embodiment, in response to detecting a plurality of active consumers, ACMCS 192 outputs the selected media content 612 by alternating between media content linked to the media preferences profile of a first active consumer detected and media content linked to the media preferences profile of each other active consumer detected. In context 600, ACMCS 192 outputs first album 416 associated with media preferences profile 1 126a of detected first registered user 604, outputs second playlist 405 associated with media preferences profile 2 126b of detected second registered user 606, and outputs third song 418 associated with media preferences profile 3 126c of detected third registered user 608. In context 600, in response to detecting first, second, and third registered users 604, 606, 608 as a plurality of registered users who are active consumers, ACMCS 192 alternates between media content by outputting the first song 406 of first album 416 associated with media preferences profile 1 126a of detected first registered user 604, followed by outputting the first song of second playlist 405 associated with media preferences profile 2 126b of detected second registered user 606, followed by outputting third song 418 associated with media preferences profile 3 126c of detected third registered user 608, followed by outputting the second song 408 of first album 416 associated with media preferences profile 1 126a of detected first registered user 604, followed by outputting the second song of second playlist 405 associated with media preferences profile 2 126b of detected second registered user 606, followed by again outputting third song 418 associated with media preferences profile 3 126c of detected third registered user 608. In some embodiments, ACMCS 192 improves user experience by shuffling through similar genre songs, thus preventing multiple repeats of a single song, which may prove annoying for concurrent consumers. For example, in response to determining that the selected media preference setting (e.g., fifth media preference setting shown in FIG. 3 as 418/440) specifies an SMC-ID that identifies a single song, ACMCS 192 automatically adapts the relevant SMC-ID (e.g., third song 418) to identify a playlist of other songs that are similar to the single song (e.g., third song 418).

In context 602 shown in FIG. 6B, ACMCS 192 detects a change of state for at least one detected registered user. More particularly, in context 602, ACMCS 192 detects a change of state for the detected third registered user 608 from being an active consumer to being a non-consumer. As shown in FIG. 6B, third registered user 608 is wearing a wearable device 650 (illustrated as earphones) that provides at least one of: an electronic indication 652 indicating to electronic device 100 that third registered user 608 is in the non-consumer state, or a visual indicator to onlookers (i.e., first and second registered users 200 and 606) that that third registered user 608 is not consuming the media content 612 outputted in context 600.

ACMCS 192 updates context information 136 to indicate the asleep state of third registered user 608. Based on contextual information 136 identifying the presence and asleep state of third registered user 608 corresponding to context 602, ACMCS 192 ceases from outputting media content associated with the media preferences profile of the detected registered user whose state changed from being an active consumer to a non-consumer. Particularly, ACMCS 192 ceases from outputting songs 418 associated with media preferences profile 3 126c of detected third registered user 608. ACMCS 192 outputs media content 654, which represents the media content 612 excluding the removed songs 418 associated with media preferences profile 3 126c of detected third registered user 608. ACMCS 192 outputs, via output device(s) 150, the selected specific media content 654 associated with the media preferences profile of the present registered user(s) who is an active consumer(s). In context 602, in response to detecting first and second registered users 604 and 606 as a plurality of registered users who are active consumers, ACMCS 192 outputs the selected media content 654 by alternating between media content by outputting the first song 406 of first album 416 associated with media preferences profile 1 126a of detected first registered user 604, followed by outputting the first song of second playlist 405 associated with media preferences profile 2 126b of detected second registered user 606, followed by outputting the second song 408 of first album 416 associated with media preferences profile 1 126a of detected first registered user 604, followed by outputting the second song of second playlist 405 associated with media preferences profile 2 126b of detected second registered user 606.

Now, an example transition from context 602 (FIG. 6B) back to context 600 (FIG. 6A) will be described. For instance, first or second registered users 604, 606 may notice and orally comment (e.g., saying "[name of registered user 3] is waking up" or "[name of registered user 3], welcome back!" or "[name of registered user 3], you took your headphones off!") that third registered user 608 has subsequently removed her/his headphones. Similarly, in one embodiment, a wearable device worn by third registered user 608 and associated with third user ID 122c sends a signal to ACMCS 192, indicating that third registered user 608 has awaked from sleeping. In response, ACMCS 192 records a change of state for the detected third registered user 608 from being a non-consumer to being an active consumer. ACMCS 192 updates context information 136 to indicate the active state of third registered user 608. Based on the updated context information 136 corresponding to context 600 (FIG. 6A), ACMCS 192 resumes outputting (e.g., as part of the alternating pattern) song 418 associated with media preferences profile 3 126c of detected third registered user 608. As described above, in some embodiments, based on the updated context information 136 corresponding to context 600 (FIG. 6A), ACMCS 192 resumes outputting (e.g., as part of the alternating pattern) a playlist of songs similar to third song 418.

Figure 7A:
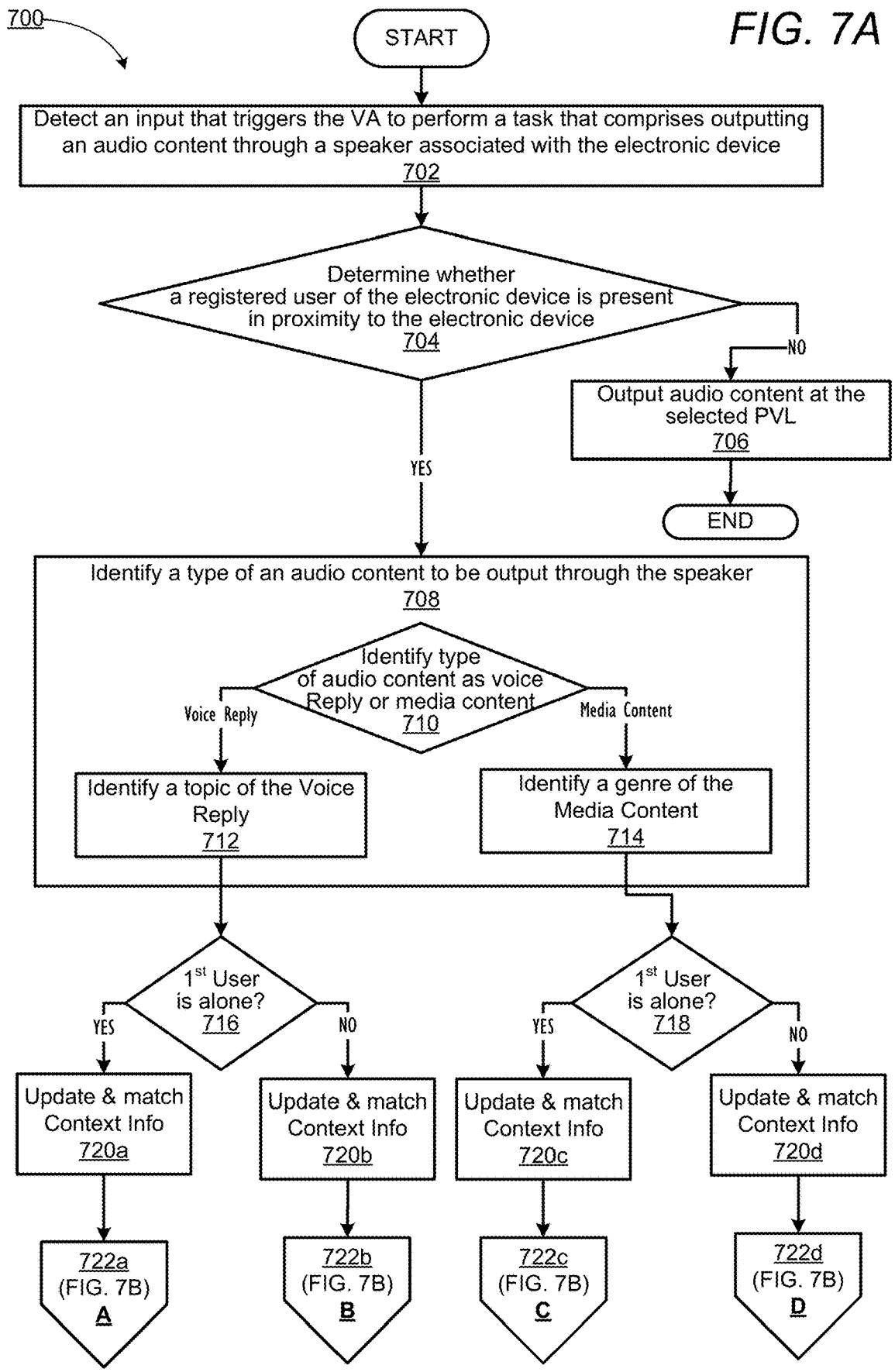
FIGS. 7A and 7B is a flow chart illustrating a method for context-based volume adaptation by a voice assistant of an electronic device, in accordance with one or more embodiments.
Figure 7B:
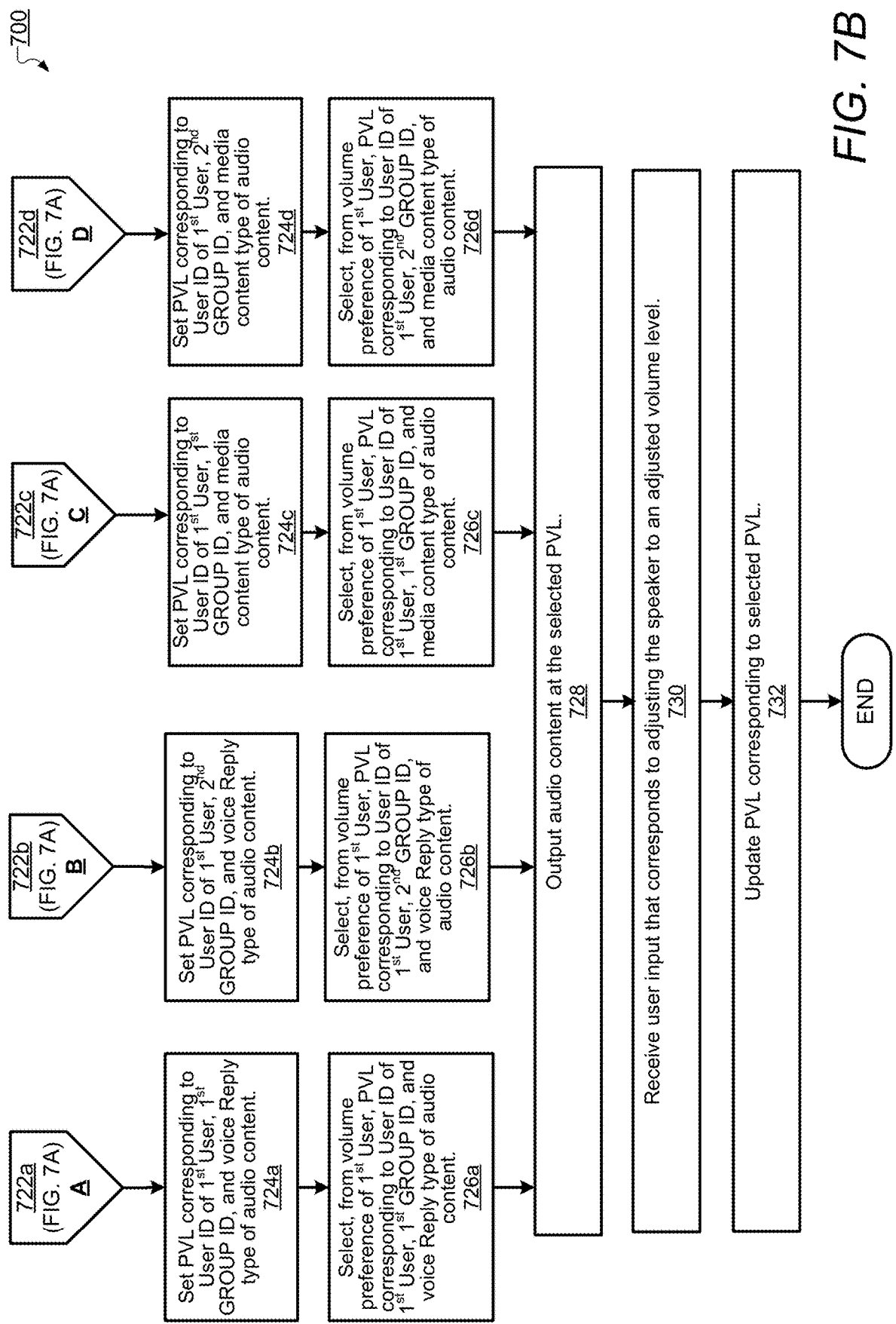

With reference now to FIG. 7 (FIGS. 7A and 7B), there is illustrated a method 700 for context-based volume adaptation by a voice assistant of an electronic device, in accordance with one or more embodiments. More particularly, FIG. 7 provides a flow chart of an example method 700 for operating VPM module 190 that sets and updates volume preferences of users and performs context-based volume adaptation, in accordance with one or more embodiments. The functions presented within method 700 are achieved by processor execution of VPM module 190 within electronic device 100 or mobile device 200, in accordance with one or more embodiments. The description of method 700 will be described with reference to the components and examples of FIGS. 1-6B. Several of the processes of the method provided in FIG. 7 can be implemented by one or more processors (e.g., processor(s) 105 or processor IC 205) executing software code of VPM module 190 or 290 within a data processing system (e.g., electronic device 100 or mobile device 200). The method processes described in FIG. 7 are generally described as being performed by processor 105 of electronic device 100 executing VPM module 190, which execution involves the use of other components of electronic device 100.

Method 700 begins at the start block, then proceeds to block 702. At block 702, processor 105 detects an input that triggers the VA to perform a task that comprises outputting an audio content through a speaker associated with the electronic device.

At decision block 704, processor 105 determines whether a registered user of electronic device 100 is present in proximity to the electronic device 100. More particularly, processor 105 determines whether (i) at least one registered user of electronic device 100 is present in proximity to the electronic device 100 or (ii) at least one non-registered user of electronic device 100 is present in proximity to the electronic device 100. In at least one embodiment, process 105 determines whether a registered user of electronic device 100 is present in proximity to the electronic device 100 by detecting and/or capturing a face in a field of view of a camera sensor of the electronic device and determining whether the detected and/or captured face matches a face identifier stored along with the user ID or associated with the registered user.

At block 706, in response to determining that no registered user is present in proximity to the electronic device, processor 105 outputs the audio content 510 via the speaker 154 at a current volume level 138 of the electronic device. Method 700 proceeds from block 706 to the end block.

At block 708, in response to determining that a registered user is present in proximity to the electronic device 100, processor 105 identifies a type of the audio content to be outputted through the speaker 154. More particularly, processor 105 identifies (at block 710) the type of the audio content as either a voice reply type or a media content type. In at least one embodiment, in response to identifying the audio content is a voice reply type, processor 105 identifies (at block 712) a topic of the voice reply. In at least one embodiment, in response to identifying the audio content as the media content type of audio content, processor 105 identifies (at block 714) a genre of the media content. Based on processor identifying the audio content as voice reply, method 700 proceeds to block 716 from either block 708 or block 712. Similarly, method 700 proceeds to block 718 from either block 708 or block 714 based on processor identifying the audio content as media content. Based on the identified type of audio content, method 700 proceeds to determining whether the registered user of electronic device 100 is alone, at either block 716 or block 718.

At decision block 716, processor 105 determines which people, if any, are present in proximity to electronic device 100. More particularly, in the process of determining which person(s) is present in proximity to electronic device 100, processor 105 determines: (i) a user ID (from users registry 122) of each registered user of electronic device 100 that is present in proximity to the electronic device 100; and/or (ii) whether no one, one person, or multiple people are present in proximity to electronic device 100. In at least one embodiment, in the process of determining which person(s) is present in proximity to electronic device 100, processor 105 determines whether at least one non-registered user (e.g., non-registered user 560 of FIG. 5B) is also present in proximity to electronic device 100 along with the registered user (e.g., first registered user 504 of FIG. 5B). In at least one embodiment of block 716, processor 105 determines whether the registered user, in proximity to electronic device 100, as determined at block 704, is alone (i.e., the only person present in proximity to electronic device 100). In response to determining that the registered user is alone, processor 105 updates (at block 720a) contextual information 136 to include alone designation 304 (FIG. 3) (additionally shown as "1$^{st}$ GROUP ID" in FIG. 7B). For example, as shown in FIG. 4, processor 105 updates contextual information 136 to include first group designation 412. In response to determining that the registered user is not alone (e.g., accompanied), processor 105 updates (at block 720b) contextual information 136 to include an applicable group designation (e.g., group designation 336) (additionally shown as "2$^{nd}$ GROUP ID" in FIG. 7B).

At decision block 718, in response to identifying the audio content is a media content type, processor 105 determines whether the registered user, in proximity to electronic device 100 is alone. In response to determining that the registered user is alone, processor 105 updates (at block 720c) contextual information 136 to include alone designation 304. In response to determining that the registered user is not alone, processor 105 updates (at block 720d) contextual information 136 to include an applicable group designation (e.g., group designation 336).

At blocks 720a-720d, processor 105 updates contextual information 136 based on the determination that the registered user, in proximity to electronic device 100, is or is not alone, and processor 105 determines whether the updated contextual information 136 matches a context criteria 129 defined in volume preference settings 124a of the registered user. More particularly, at blocks 720a-720d, processor 105 updates contextual information 136 by assigning one applicable alone/group designation to contextual information 136 identifying which registered user(s) are in proximity to electronic device 100 or identifying that the registered user associated with the first user ID and the at least one non-registered user as concurrent consumers of the audio content. For example, at blocks 720a and 720c, processor 105 optionally assigns an alone designation (e.g., 304 of FIG. 3 or 412 of FIG. 4) to contextual information 136, and identifies a PVL 128 (or context criteria 129), which is within volume preference settings 1 124b of the registered user, that corresponds to (e.g., matches) contextual information 136 identifying that the registered user is alone. For example, at blocks 720b and 720d, processor 105 assigns one of multiple group designation (e.g., 428, 432, 438, 442, 444 of FIG. 4) to contextual information 136, and identifies a PVL 128 (or context criteria 129), which is within volume preference settings 1 124b of the registered user, that corresponds to contextual information 136 identifying which registered users are in proximity to the electronic device 100. Method 700 proceeds from blocks 720a-720d to respective blocks 722a-722d (FIG. 7B).

At transition block 722a, method 700 proceeds along connecting path A from FIG. 7A to FIG. 7B, and then proceeds to block 724a. Similarly, at transition blocks 722b, 722c, and 722d, method 700 proceeds along connecting paths B, C, and D respectively from FIG. 7A to FIG. 7B, and then proceeds to block 724b, 724c, and 724d, respectively.

At blocks 724a-724d, processor 105 sets a preferred volume level (PVL) corresponding to the contextual information 136 identifying the current context. More particularly, in response to determining the volume preference settings 124a of the registered user comprises no value for a selected PVL (i.e., PVL identified at a relevant one of blocks 720a-720d), processor 105 sets the selected PVL to the current volume level 138.

At blocks 726a-726d, processor 105 selects, from the set of volume preferences 1 124a associated with the registered user present in proximity to electronic device 100, a PVL corresponding to the current context. More particularly, processor 105 selects the PVL corresponding to the current context from volume preference settings 124a of the registered user. The selection is based on contextual information 136 matching a context criteria defined in the volume preference settings 124a of the registered user. The contextual information 136 includes at least the user ID 122a, a specific group designation (e.g., second group designation 428 of FIG. 4) identifying each concurrent consumer of the audio content who is present in proximity to the electronic device, and a type of the audio content.

At block 728, processor 105 outputs the audio content at the selected PVL, based on the set of volume preference settings 124a of the registered user (e.g., first registered user 504). More particularly, processor 105 outputs the audio content at the selected PVL through at least one output device 150 of electronic device 100, such as through speaker 154 and/or display 152.

At block 730, processor 105 detects/receives user input that corresponds to adjusting the speaker to an adjusted volume level 139. At block 732, in response to receiving the user input that corresponds to adjusting the speaker to an adjusted volume level, processor 105 updates the volume preference settings 124a of the registered user such that the selected PVL (i.e., selected at a corresponding one of blocks 726a-726d) matches the adjusted volume level 139. This process of updating the volume preferences settings 124a enables autonomous learning of new user preferences and/or adjustments of the volume preference settings based on the newly acquired/received information. The method 700 concludes at the end block.

Figure 8A:
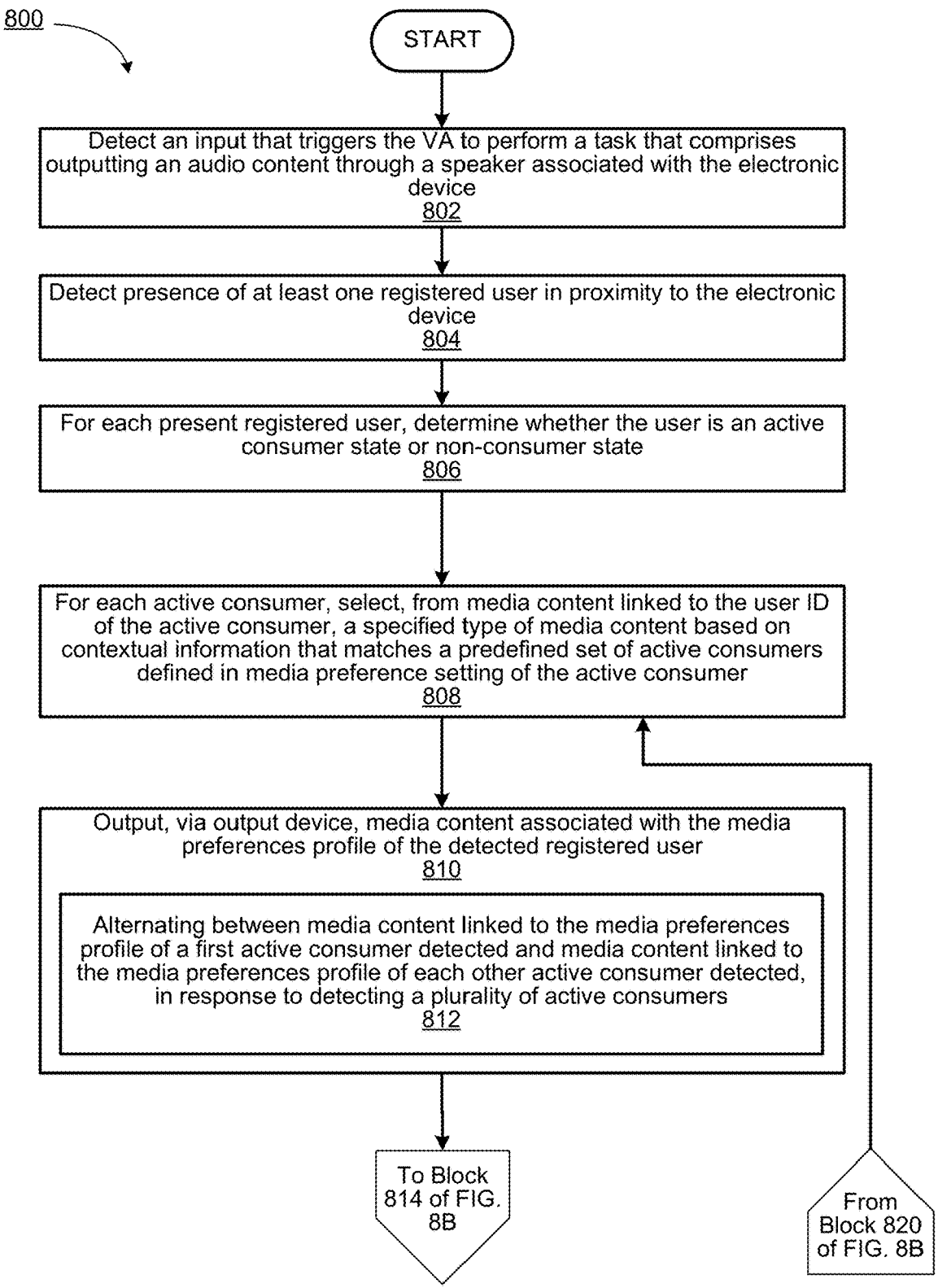
FIGS. 8A and 8B is a flow chart illustrating a method for operating an active consumer media content selector (ACMCS) module that configures an electronic device to selectively output media content associated with each detected registered user that is an active consumer, in accordance with one or more embodiments.
Figure 8B:
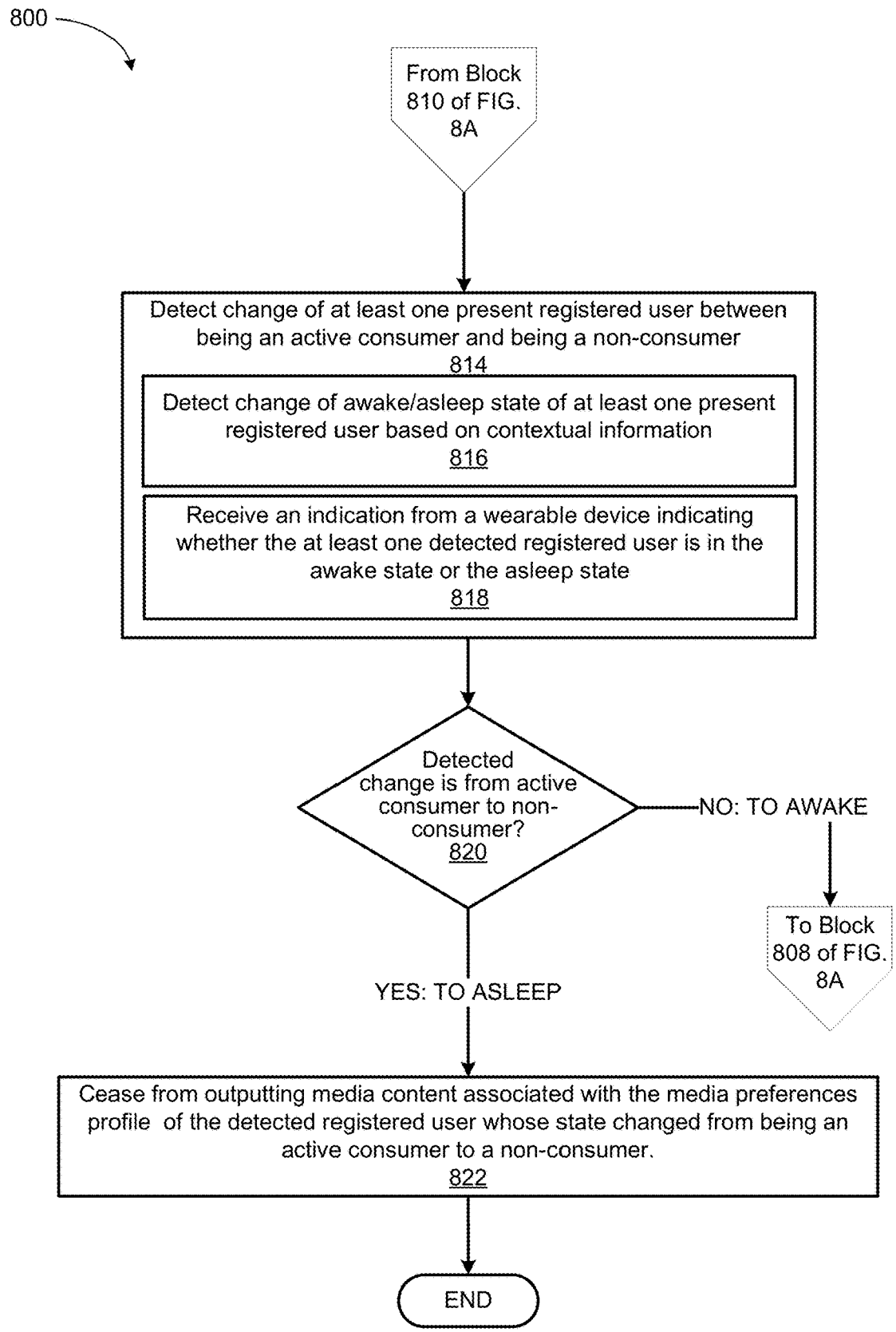

With reference now to FIG. 8 (FIGS. 8A and 8B), there is illustrated a method 800 for operating ACMCS module 192 that configures an electronic device 100 to selectively output media content associated with a media preferences profile 126a-126c of each detected registered user that is an active consumer, in accordance with one or more embodiments. The functions presented within method 800 are achieved by processor execution of ACMCS module 192 within electronic device 100 or mobile device 200, in accordance with one or more embodiments. The description of method 800 will be described with reference to the components and examples of FIGS. 1-6B. Several of the processes of the method provided in FIG. 8 can be implemented by one or more processors (e.g., processor(s) 105 or processor IC 205) executing software code of ACMCS module 192 or 292 within an electronic device 100 (e.g., mobile device 200). The processes described in FIG. 8 are generally described as being performed by processor 105 of electronic device 100 executing ACMCS module 192, which execution involves the use of other components of electronic device 100.

Method 800 begins at the start block, then proceeds to block 802. At block 802, processor 105 detects, at electronic device 100 providing a virtual assistant (VA) 113, an input that triggers the VA 113 to perform a task that comprises outputting media content through an output device 150 associated with the electronic device 100.

At block 804, processor 105 detects a presence of at least one registered user 504 in proximity to the electronic device 100. Each registered user is associated with a corresponding media preferences profile 126a-126c. In at least one embodiment, processor 105 detects the presence of the at least one registered user in proximity to the electronic device 100 by detecting and/or capturing a face in a field of view of a camera sensor of the electronic device and determining whether the detected and/or captured face matches a face identifier ID stored along with the user ID or associated with the registered user.

At block 806, for each detected registered user, processor 105 identifies whether the detected registered user is an active consumer. An active consumer is a person who is actively listening or viewing (i.e., consuming) the provided content. Specifically, processor 105 determines whether the detected registered user is an active consumer based on determining an active-consumer/non-consumer state of the detected registered user. In at least one embodiment, processor 105 determines whether the detected registered user is in the active-consumer state or non-consumer state based on an awake/asleep state of the detected registered user. In at least one embodiment, processor 105 determines an active-consumer/non-consumer state of the detected registered user based on audio input received by the electronic device. In one embodiment, the audio input comprises speech of an active consumer, other than the detected registered user, which speech includes words describing whether the detected registered user is in the active-user state (e.g., awake state) or in the non-consumer state (e.g., asleep state). In at least one embodiment, processor 105 determines an active-consumer/non-consumer state of the detected registered user based on audio input received by the electronic device, the audio input comprising a speech of the detected registered user. In at least one embodiment, processor 105 determines an awake/sleep state of the detected registered user based on audio input received by an indication from a wearable device indicating whether the at least one present registered user is in the awake state or the asleep state.

At block 808, for each active consumer detected, processor 105 selects, from media content linked to the media preferences profile 126a of the detected active consumer, a type of media content based on contextual information 136 that comprises a predefined set of registered users being determined as active consumers. The predefined set of registered users is defined in the media preferences profile 126a of the detected active consumer. The type of media content comprises at least one of: a specific genre of artistic work; artistic work performed by a specific artist; a specific streaming source of artistic work; or artistic work within a specific directory of stored media content accessible by the electronic device.

At block 810, in response to determining that a detected registered user is an active consumer, processor 105 outputs, via the output device 150, media content associated with the media preferences profile 126a of the detected registered and active user. In at least one embodiment, in response to detecting a plurality of active consumers, processor 105 outputs the media content by alternating (at block 812) between media content linked to the media preferences profile of a first active consumer detected and media content linked to the media preferences profile of each other active consumer detected.

At block 814, processor 105 detects a change of state of at least one detected registered user between the active-consumer state and the non-consumer state. In at least one embodiment of block 814, processor 105 detects a change of state for the detected registered user from being an active consumer to being a non-consumer. In at least one other embodiment of block 814, processor 105 detects a change of state for the detected registered user from being a non-consumer to being an active consumer. Processor 105 detects the change of state, for example, based on audio input received by the electronic device 100. In at least one embodiment, processor 105 detects (at block 816) a change of awake/sleep state of at least one detected registered user based on detected contextual information. In another embodiment, processor 105 detects (at block 818) a change of awake/sleep state of at least one detected registered user by receiving an indication from a wearable device indicating whether the at least one detected registered user is in the awake state or the asleep state.

At decision block 820, in response to determining the detected change of state for the detected registered user is from being in an active-consumer state to being in a non-consumer state, method 800 proceeds to block 822. Also, in response to determining the detected change of state for the detected registered user is from being in the non-consumer state to being in the active-consumer state, method 800 returns to block 808.

At block 822, processor 105 stops outputting media content associated with the media preferences profile of the detected registered user whose state changed from being an active consumer to a non-consumer. The process 800 concludes at the end block.

In the above-described flowcharts of FIGS. 7 and 8, one or more of the method processes may be embodied in a computer readable device containing computer readable code such that a series of steps are performed when the computer readable code is executed on a computing device. In some implementations, certain steps of the methods are combined, performed simultaneously or in a different order, or perhaps omitted, without deviating from the scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object-oriented programming language, without limitation. These computer program instructions may be provided to a processor of a general-purpose computer, special purpose computer, or other programmable data processing apparatus to produce a machine that performs the method for implementing the functions/acts specified in the flowchart and/or block diagram block or blocks. The methods are implemented when the instructions are executed via the processor of the computer or other programmable data processing apparatus.

As will be further appreciated, the processes in embodiments of the present disclosure may be implemented using any combination of software, firmware, or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device can include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

Where utilized herein, the terms "tangible" and "non-transitory" are intended to describe a computer-readable storage medium (or "memory") excluding propagating electromagnetic signals; but are not intended to otherwise limit the type of physical computer-readable storage device that is encompassed by the phrase "computer-readable medium" or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

While the disclosure has been described with reference to example embodiments, it will be understood by those skilled in the art that various changes may be made and equivalents may be substituted for elements thereof without departing from the scope of the disclosure. In addition, many modifications may be made to adapt a particular system, device, or component thereof to the teachings of the disclosure without departing from the scope thereof. Therefore, it is intended that the disclosure not be limited to the particular embodiments disclosed for carrying out this disclosure, but that the disclosure will include all embodiments falling within the scope of the appended claims.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
    detecting, at an electronic device configured with a virtual assistant (VA), an input that triggers the VA to perform a task that includes outputting an audio content through a speaker associated with the electronic device;
    identifying a type of the audio content to be outputted through the speaker;
    determining whether a registered user of the electronic device is present in proximity to the electronic device, each registered user being associated with a unique user identifier (user ID);
    in response to determining that no registered user is present in proximity to the electronic device, outputting the audio content via the speaker at a current volume level of the electronic device; and
    in response to determining that a registered user is present in proximity to the electronic device;
        selecting a preferred volume level (PVL) from the volume preference settings of the registered user, based on contextual information matching a context defined in the volume preference settings of the registered user, the contextual information including at least the user ID, a specific group designation identifying each concurrent consumer of the audio content who is present in proximity to the electronic device, and a type of the audio content and;

outputting the audio content at the selected PVL based on volume preference settings of the registered user.

2. The method of claim 1, wherein the selected PVL corresponds to a context defined in part by the user ID of the registered user and the type of audio content, the context being defined in the volume preference settings of the registered user.

3. The method of claim 2, further comprising:
identifying the type of the audio content as one of a voice reply type or a media content type;
in response to identifying the audio content as the voice reply type of audio content, outputting the audio content at a first PVL corresponding to the context, which is determined, in part by the voice reply type of audio content; and
in response to identifying the audio content as the media content type of audio content, outputting the audio content at a second PVL corresponding to the context, which is determined, in part by the media content type of audio content.

4. The method of claim 1, further comprising:
determining whether at least one non-registered user is also present in proximity to the electronic device along with the registered user, the registered user being associated with a first user ID;
in response to determining that the registered user associated with the first user ID and the at least one non-registered user are both present in proximity to the electronic device, assigning a first group designation identifying that the registered user associated with the first user ID and the at least one non-registered user as concurrent consumers of the audio content; and
selecting, from volume preference settings of the registered user, a volume level corresponding to the assigned first group designation for the concurrent consumers.

5. The method of claim 1, further comprising:
determining whether there is a plurality of registered users, including the registered user and at least one second registered user, present in proximity to the electronic device;
in response to determining that at least one second registered user is also present in proximity to the electronic device, assigning one of multiple group designations, which indicate the plurality of registered users is consuming the audio content, to contextual information identifying which registered users are in proximity to the electronic device, each of the multiple group designations being related to a different combination of registered users in proximity to the electronic device; and
selecting, from volume preference settings of the registered user, a volume level corresponding to the assigned group designation for the contextual information.

6. The method of claim 5, wherein assigning the group designation identifying that a plurality of registered users is consuming the audio content comprises:
assigning a second group designation based on a determination that a second registered user associated with a second user ID and the registered user associated with the first user ID are concurrent consumers of the audio content; and
assigning a third group designation based on the determination that a third registered user associated with a third user ID and the registered user associated with the first user ID are concurrent consumers of the audio content.

7. The method of claim 1, further comprising:
in response to determining the volume preference settings of the registered user comprises no value for the selected PVL, setting the selected PVL to the current volume level; and
in response to receiving user input that corresponds to adjusting the speaker to an adjusted volume level, updating the volume preference settings of the registered user such that the selected PVL matches the adjusted volume level.

8. The method of claim 7, further comprising:
updating the volume preference settings of the registered user to include an additional PVL corresponding to at least one additional context variable from among:
a genre of the media content;
a state of an external electronic device associated with the first user;
a location of the registered user relative to the electronic device; or
a location of at least one concurrent consumer of the audio content other than the registered user; and
selecting the PVL based on contextual information that includes the at least one additional context variable.

9. The method of claim 1, further comprising determining whether a registered user of the electronic device is present in proximity to the electronic device by:
capturing a face in a field of view of a camera sensor of the electronic device; and
determining whether the detected face matches a face identifier stored as the user ID or associated with the registered user.

10. An electronic device comprising:
at least one microphone that receives user input;
an output device that outputs audio content;
a processor coupled to the at least one microphone and the output device, and which executes program code providing functionality of a virtual assistant (VA) and program code that enables the electronic device to:
receive, via the at least one microphone, an input that triggers the VA to perform a task that comprises outputting an audio content through a speaker associated with the electronic device;
identify a type of the audio content to be outputted through the speaker;
determine whether a registered user of the electronic device is present in proximity to the electronic device, each registered user being associated with a unique user identifier (user ID);
in response to determining that no registered user is present in proximity to the electronic device, output the audio content via the speaker at a current volume level; and
in response to determining that a registered user is present in proximity to the electronic device:
select a preferred volume level (PVL) from the volume preference settings of the registered user, based on contextual information matching a context defined in the volume preference settings of the registered user, the contextual information including at least the user ID, a specific group designation identifying each concurrent consumer of the audio content who is present in proximity to the electronic device, and a type of the audio content; and output the audio content at the selected PVL based on volume preference settings of the registered user.

11. The electronic device of claim 10, wherein the selected PVL corresponds to a context defined in part by the user ID of the registered user and the type of audio content, the context being defined in the volume preference settings of the registered user.

12. The electronic device of claim 11, wherein the program code further enables the electronic device to:
identify the type of the audio content as one of a voice reply type or a media content type;
in response to identifying the audio content as the voice reply type of audio content, output the audio content at a first PVL corresponding to the context, which is determined in part by the voice reply type of audio content; and
in response to identifying the audio content as the media content type of audio content, output the audio content at a second PVL corresponding to the context, which is determined in part by the media content type of audio content.

13. The electronic device of claim 10, wherein the program code further enables the electronic device to:
determine whether there is a plurality of registered users, including the registered user and at least one second registered user, present in proximity to the electronic device;
in response to determining that at least one second registered user is also present in proximity to the electronic device, assign one of multiple group designations, which indicate the plurality of registered users is consuming the audio content, to contextual information identifying which registered users are in proximity to the electronic device, each of the multiple group designations being related to a different combination of registered users in proximity to the electronic device; and
select, from volume preference settings of the registered user, a volume level corresponding to the assigned group designation for the contextual information.

14. The electronic device of claim 13, wherein the program code that enables the electronic device to assign one of the multiple group designations to contextual information identifying which registered users are in proximity to the electronic device, further enables the electronic device to:
assign a second group designation based on a determination that a second registered user associated with a second user ID and the registered user associated with the first user ID are concurrent consumers of the audio content; and
assign a third group designation based on the determination that a third registered user associated with a third user ID and the registered user associated with the first user ID are concurrent consumers of the audio content.

15. The electronic device of claim 10, wherein the program code further enables the electronic device to:
in response to determining the volume preference settings of the registered user comprises no value for the selected PVL, set the selected PVL to the current volume level; and
in response to receiving user input that corresponds to adjusting the speaker to an adjusted volume level, update the volume preference settings of the registered user such that the selected PVL matches the adjusted volume level.

16. The electronic device of claim 15, wherein the program code further enables the electronic device to:
update the volume preference settings of the registered user to include an additional PVL corresponding to at least one additional context variable from among:
a genre of the media content;
a state of an external electronic device associated with the first user;
a location of the registered user relative to the electronic device; or
a location of at least one concurrent consumer of the audio content other than the registered user; and
selecting the PVL based on contextual information that includes the at least one additional context variable.

17. The electronic device of claim 10, further comprising:
a camera senor that detects a face of the registered user in a field of view of the camera sensor;
wherein the program code further enables the electronic device to determine whether a registered user of the electronic device is present in proximity to the electronic device by determining whether a face detected by the camera sensor matches a face identifier stored as the user ID or associated with the registered user.

18. A computer program product comprising:
a non-transitory computer readable storage device;
program code on the computer readable storage device that when executed by a processor associated with an electronic device that provides functionality of a virtual assistant (VA), the program code enables the electronic device to provide the functionality of:
detecting, at the electronic device, an input that triggers the VA to perform a task that comprises outputting an audio content through a speaker associated with the electronic device;
identifying a type of the audio content to be outputted through the speaker;
determining whether a registered user of the electronic device is present in proximity to the electronic device, each registered user being associated with a user identifier (user ID);
in response to determining that no registered user is present in proximity to the electronic device, outputting the audio content via the speaker at a current volume level; and
in response to determining the registered user is present in proximity to the electronic device:
selecting a preferred volume level (PVL) from the volume preference settings of the registered user, based on contextual information matching a context defined in the volume preference settings of the registered user, the contextual information including at least the user ID, a specific group designation identifying each concurrent consumer of the audio content who is present in proximity to the electronic device, and a type of the audio content; and
outputting the audio content at the selected PVL based on volume preference settings of the registered user.

19. The computer program product of claim 18, wherein:
the selected PVL corresponds to a context defined in part by the user ID of the registered user and the type of audio content, the context being defined in the volume preference settings of the registered user; and
the program code comprises program code that, when executed by the processor, enables the electronic device to provide the functionality of:

identifying the type of the audio content as one of a voice reply type or a media content type;

in response to identifying the audio content as the voice reply type of audio content, outputting the audio content at a first PVL corresponding to the context, which is determined in part by the voice reply type of audio content; and in response to identifying the audio content as the media content type of audio content, outputting the audio content at a second PVL corresponding to the context, which is determined in part by the media content type of audio content.

20. The computer program product of claim 16, wherein the program code comprises program code that, when executed by the processor, enables the electronic device to provide the functionality of:

determining whether there is a plurality of registered users, including the registered user and at least one second registered user, present in proximity to the electronic device;

in response to determining that at least one second registered user is present in proximity to the electronic device, assigning one of multiple group designations, which indicate the plurality of registered users is consuming the audio content, to contextual information identifying which registered users are in proximity to the electronic device, each of the multiple group designations being related to a different combination of registered users in proximity to the electronic device; and selecting, from volume preference settings of the registered user, a volume level corresponding to the assigned group designation for the contextual information.

* * * * *